(12) United States Patent
Kobayashi

(10) Patent No.: US 8,063,545 B2
(45) Date of Patent: Nov. 22, 2011

(54) WAFER, WAFER POLISHING APPARATUS, WAFER POLISHING METHOD, METHOD OF FABRICATING PIEZOELECTRIC VIBRATOR, PIEZOELECTRIC VIBRATOR, OSCILLATOR, ELECTRONIC APPARATUS AND RADIOWAVE TIMEPIECE

(75) Inventor: Takashi Kobayashi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 322 days.

(21) Appl. No.: 12/361,913

(22) Filed: Jan. 29, 2009

(65) Prior Publication Data

US 2010/0231088 A1 Sep. 16, 2010

(30) Foreign Application Priority Data

Feb. 14, 2008 (JP) ................................. 2008-033070

(51) Int. Cl.
*H01L 41/00* (2006.01)

(52) U.S. Cl. ............. 310/370; 310/311; 451/36; 451/78

(58) Field of Classification Search .................. 310/370; 451/78, 36
See application file for complete search history.

(56) References Cited

U.S. PATENT DOCUMENTS

| 2003/0181141 A1* | 9/2003 | Taniguchi et al. ............... 451/36 |
| 2006/0125354 A1* | 6/2006 | Boecking et al. .............. 310/367 |
| 2007/0176520 A1* | 8/2007 | Yoshioka et al. ............. 310/365 |
| 2008/0120821 A1* | 5/2008 | Ikeda et al. ................... 29/25.35 |
| 2008/0248728 A1* | 10/2008 | Kanaya et al. .................. 451/36 |

FOREIGN PATENT DOCUMENTS

| JP | 2006-339896 | 12/2006 |
| JP | 2007-184810 | 7/2007 |

\* cited by examiner

*Primary Examiner* — Walter Benson
*Assistant Examiner* — Bryan Gordon
(74) *Attorney, Agent, or Firm* — Brinks Hofer Gilson & Lione

(57) ABSTRACT

To provide a wafer preventing a breakage of a crack or a chip off from being brought about in a polishing step and a polishing apparatus and a polishing method of polishing the wafer, there is provided a wafer in a shape of a plate substantially in an angular rectangular shape used as a raw material of a piezoelectric vibrator. All of corner portions D1, D2, D3, D4 substantially in the angular shape are formed in shapes of curved faces by chamfering providing curvatures. The corner portions D1, D2, D3, D4 in the shapes of the curved faces at least include a first curved face portion and a second curved face portion chamfered by curvatures different from each other or the same curvature. A reference face of a crystal orientation of the raw material is specified by the first curved face portion or the second curved face portion.

10 Claims, 22 Drawing Sheets

WAFER, WAFER POLISHING APPARATUS, WAFER POLISHING METHOD, METHOD OF FABRICATING PIEZOELECTRIC VIBRATOR, PIEZOELECTRIC VIBRATOR, OSCILLATOR, ELECTRONIC APPARATUS AND RADIOWAVE TIMEPIECE

RELATED APPLICATIONS

This application claims priority under 35 U.S.C. §119 to Japanese Patent Application No. JP2008-033070 filed on Feb. 14, 2008, the entire content of which is hereby incorporated by reference.

BACKGROUND OF THE INVENTION

1. Field of the Invention

The present invention relates to a wafer, a wafer polishing apparatus of polishing a wafer to adjust a predetermined thickness, a wafer polishing method, a method of fabricating a piezoelectric vibrator of fabricating a piezoelectric vibrator by utilizing the wafer polishing method, a piezoelectric vibrator fabricated by the fabricating method, an oscillator, an electronic apparatus and a radiowave timepiece having the piezoelectric vibrator.

2. Description of the Related Art

In recent years, a portable telephone or a portable information terminal apparatus uses a piezoelectric vibrator utilizing quartz or the like as a time source, a timing source of a control signal or the like or a reference signal source or the like. As a piezoelectric vibrator of this kind, various ones are known, for example, a piezoelectric vibrator having a piezoelectric vibrating piece of a tuning fork type, a piezoelectric vibrator having a piezoelectric vibrating piece of carrying out a thickness slipping vibration or the like is known.

Meanwhile, the piezoelectric vibrating piece is formed by various piezoelectric members of quartz, lithium tantalite, lithium niobate and the like. Specifically, a raw stone of a piezoelectric member is cut to constitute a wafer, thereafter, the wafer is polished to a predetermined thickness. Further, the polished wafer is cleaned and dried, thereafter, etched by a photolithography technology to form an outer shape of a piezoelectric vibrating piece, and an electrode is formed by patterning a predetermined metal film. Thereby, a plurality of piezoelectric vibrating pieces can be fabricated at a time from a single wafer.

According to the piezoelectric vibrating piece fabricated in this way, a thickness of its own depends on a thickness of a wafer, and therefore, the above-described polishing is made to constitute a particularly important step for determining a quality or the like. Normally, in polishing, a lapping step of roughly polishing a wafer cut from a raw stone to a thickness to some degree, and a polishing step of subjecting the wafer to mirror face polishing to finish highly accurately to a predetermined thickness after the lapping step are carried out. Further, a wafer subjected to such polishing in a shape of a rectangular plate (including square plate shape) near to a state of cutting a raw stone is frequently used as a mode thereof (refer to, for example, JP-A-2006-339896, JP-A-2007-184810).

Further, the polishing is carried out generally by utilizing a general polishing apparatus. Here, a polishing apparatus of a background art will be simply explained in reference to FIG. 28 through FIG. 31.

As shown by FIG. 28 and FIG. 29, a polishing apparatus 200 includes a sun gear 201, an internal gear 202, and a carrier 203. Further, upper and lower sides of the carrier 203 are arranged with an upper surface plate 204 and a lower surface plate 205. Both of the sun gear 201 and the internal gear 202 are rotated in counterclockwise direction, and the carrier 203 is made to carry out a planetary movement. That is, the carrier 203 is revolved in the counterclockwise direction while rotating the carrier 203 in the clockwise direction.

The carrier 203 is constituted by a circular plate of, for example, a diameter of several inches, formed to be sufficiently thin in comparison with a wafer S1 before being polished, and is formed with a holding hole 203A of holding the wafer S1. As shown by FIG. 30, the holding hole 203A is formed in a square shape or a rectangular shape in an opening thereof in correspondence with the shape of the wafer S1, and is formed in a square shape (rectangular shape) one size larger than the wafer S1 to hold the wafer S1 with play. Further, in the example, only one of the holding hole 203A is formed to the carrier 203 in accordance with large-sized formation of the wafer S1.

Further, a plurality of pieces of the carriers 203 are arranged at respective predetermined angles between the upper surface plate 204 and the lower surface plate 205, and therefore, according to the polishing apparatus 200, a plurality of the wafers S1 can simultaneously be polished by 1 batch of polishing.

The upper surface plate 204 and the lower surface plate 205 are attachably and detachably fixed with polishing pads P at respective faces thereof opposed to each other. Further, the wafer S1 held by the carrier 203 is pinched by the two surface plates 204, 205 from upper and lower sides. At this occasion, the upper surface plate 204 is brought into a state of applying a predetermined load on the wafer S1. The lower surface plate 205 is rotated in the counterclockwise direction constituting a direction reverse to a direction of revolving the carrier 203.

Further, as shown by FIG. 29 and FIG. 31, the upper surface plate 204 is formed with a plurality (several tens) pieces of supply paths 204a penetrating the upper surface plate 204 for supplying a polishing solution W to between the two surface plates 204, 205. Specifically, the supply paths 204a are formed at respective predetermined intervals along an inner side circle of a radius ra, a middle circle of a radius rb, an outer side circle of a radius rc. Further, the polishing solution W is supplied to the supply path 204a by way of a supply hose, not illustrated. Thereby, the polishing solution W can be supplied to between the two surface plates 204, 205 by way of the respective supply paths 204a and the wafer S1 can be polished by utilizing the polishing solution W.

Further, the polishing pad P formed at the upper surface plate 204 is formed with an opening so as not to close the supply path 204a. Further, the polishing solution W mixed with a polishing agent of a small particle size is used. Further, when the lapping step or the polishing step is carried out, normally, different polishing apparatus 200 are used although the polishing apparatus 200 are constructed by the same constitution. However, when lapping is carried out, normally, the polishing pads P are respectively detached from the upper surface plate 204, the lower surface plate 205 and are not used. This is for progressing lapping by finely destructing the wafer surface by a polishing member (isolated abrasive grain).

A simple explanation will be given of a case of polishing the wafer S1 by carrying out a lapping step by the polishing apparatus 200 constituted in this way.

First, the respective carriers 203 are set on the lower surface plate 205 in a state of separating the upper surface plate 204 and the lower surface plate 205. Further, the wafers S1 are respectively set to the holding holes 203A of the respective carriers 203 set in this way. After finishing the setting step in this way, the upper surface plate 204 is moved down and the upper surface plate 204 is pressed to the upper face of the wafer S1 by a predetermined load and the wafer S1 is squeezed by the two surface plates 204, 205.

Further, the carrier 203 is rotated and revolved by driving the sun gear 201, the internal gear 202 while supplying the polishing solution W to between the two surface plates 204, 205 by way of the supply path 204a. Further, the lower surface plate 205 is rotated simultaneously therewith. Thereby, the both faces of the wafer S1 held by the carrier 203 can be polished and the thickness of the wafer S1 can be finished to a predetermined thickness.

However, there is the following problem to be improved in polishing the wafer described above.

With regard to the wafer S1, the large-sized formation is progressed as described above in order to promote mass production performance by increasing a number of pieces taken from a single wafer. On the other hand, in order to meet a request for small-sized formation, also thin thickness formation of the wafer S1 is progressed. In this way, large-sized formation and thin thickness formation are simultaneously requested for the wafer S1, and therefore, when polishing is carried out in the mode shown in FIG. 30, a breakage of a crack or a chip off is liable to be brought about particularly at a corner portion thereof, as a result, yield is reduced.

Here, in polishing, normally, a corner portion of the wafer S1 shown in FIG. 30 is subjected to C chamfering (chamfering) to thereby prevent a crack or a chip off at the corner portion. However, even when the corner portion is chamfered, only a corner portion larger than right angle is formed and the corner portion still remains although the corner portion is small. Therefore, when the corner portion is brought into contact with an inner peripheral face of the holding hole 203A of the carrier 203 in polishing, point (line) contact is brought about, and therefore, by applying a large load thereto, a breakage of a crack or a chip off is liable to be brought about as described above.

That is, large-sized formation of the wafer S1 is progressed as described above, and therefore, when impacted or rubbed to the inner peripheral face of the holding hole 203A of the carrier 203 in polishing, the impact (load) is increased by an amount of large-sized formation. On the other hand, thin thickness formation is progressed, and therefore, the wafer S1 per se becomes brittle by that amount. Therefore, when impacted (loaded) considerably, a breakage of a crack or a chip off is liable to be brought about particularly at the corner portion as described above.

Further, in working a piezoelectric member of quartz or the like constituting a wafer to a piezoelectric vibrating piece, it is necessary to constitute an end face of the wafer by a reference face constituted by having an angle determined to a predetermined face based on a crystal thereof. Therefore, it is important for the wafer to be able to easily identify where such a reference face is.

SUMMARY OF THE INVENTION

The invention has been carried out in order to resolve the problem and it is a principal object thereof to provide a wafer preventing a breakage of a crack or a chip off from being brought about particularly in a polishing step, and a polishing apparatus and a polishing method of polishing the wafer.

Further, it is other object thereof to provide a method of fabricating the piezoelectric vibrator of fabricating a piezoelectric vibrator by utilizing a wafer polishing method, a piezoelectric vibrator fabricated by the fabricating method, an oscillator, an electronic apparatus and a radiowave timepiece having the piezoelectric vibrator.

The invention provides the following means in order to resolve the problem.

A wafer according to the invention is a wafer in a shape of a plate substantially in an angular shape used as a raw material of a piezoelectric vibrator;

wherein all of corner portions of the substantially angular shape are formed in a shape of a curved face by chamfering providing curvatures, and the corner portions substantially in the shape of the curved face includes at least a first curved face portion and a second curved face portion chamfered by the curvatures different from each other or the same curvature; and wherein a reference face of a crystal orientation of the raw material is specified by the first curved face portion or the second curved face portion.

According to the wafer, the corner portion is constituted by the shape of the curved face provided with a curvature, and therefore, when polishing is carried out, by using the carrier formed with the holding hole having the opening of the circular shape, a breakage of a crack or a chip off at the corner portion, that is, the curved face portion is prevented. That is, when the corner portion constituting the curved face portion is brought into contact with an inner peripheral face of the circular opening of the holding hole of the carrier, not point (line) contact but substantially face contact is constituted, and therefore, a large load (impact) is not applied locally, and the load is dispersed. Therefore, a breakage of a crack or a chip off brought about by a local large load is prevented.

Further, the first curved face portion and the second curved face portion having the curvatures different from each other or the same curvature are provided, and therefore, particularly when the first curved face portion and the second curved face portion are constituted by the curvatures different from each other, or lengths of curved portions of the first curved face portion and the second curved face portion, that is, lengths of circular arc portions when viewed planely are made to differ from each other, a reference face of a crystal orientation of a raw material is specified by the first curved face portion or the second curved face portion, and therefore, it can easily be identified where the reference face is.

Further, it is preferable that according to the wafer of the invention, in the wafer of the invention, the wafer is constituted by substantially a rectangular shape, two of the corner portions contiguous to each other are made to constitute the first curved face portions and other two of the corner portions are made to constitute the second curved face portions, and the reference face of the crystal orientation of the raw material is a face formed between the first curved face portions, or an end face formed between the second curved face portions. With this configuration, the reference face can more easily identified.

A wafer polishing apparatus according to the invention is a wafer polishing apparatus of polishing two head and tail faces of the wafer by supplying a polishing solution to adjust a thickness of the wafer to a predetermined thickness, the wafer polishing apparatus comprising:

a carrier in a shape of a circular plate an outer peripheral edge of which is made to constitute a gear portion and which is formed with a holding hole of containing the wafer;

a planetary gear mechanism brought in mesh with the carrier by way of the gear portion and revolving the carrier around an axis line while rotating the carrier;

an upper surface plate and a lower surface plate formed in a shape of a circular plate a center of which is hollowed and arranged on upper and lower sides of the carrier for squeezing both faces of the wafer while applying a predetermined load to the wafer contained in the holding hole; and polishing solution supplying means for supplying the polishing solution to between the upper surface plate and the lower surface plate;

wherein the holding hole of the carrier includes an opening in a circular shape, and a curvature of the circular shape of the opening is the same as or smaller than the smallest curvature of the curvatures of the corner portions of the wafer.

A method of polishing a wafer according to the invention is a wafer polishing method including a polishing step of adjusting a thickness of a wafer to a predetermined thickness by polishing both head and tail faces of the wafer while supplying a polishing solution from polishing solution supplying means by a wafer polishing apparatus comprising a carrier in a shape of a circular plate an outer periphery edge of which is made to constitute a gear portion and which is formed with a holding hole of containing the wafer, a planetary gear mechanism brought in mesh with the carrier by way of the gear portion for revolving the carrier around an axis line while rotating the carrier, an upper surface plate and a lower surface plate formed in a shape of a circular plate a center of which is hollowed and arranged on upper and lower sides of the carrier for squeezing both faces of the wafer while applying a predetermined load to the wafer contained in the holding hole, and the polishing solution supplying means for supplying the polishing solution to between the upper surface plate and the lower surface plate;

wherein the holding hole of the carrier includes an opening in a circular shape, and a curvature of the circular shape of the opening is the same as or smaller than the smallest curvature of curvatures of corner portions of the wafer.

In the wafer polishing apparatus and the wafer polishing method according to the invention, as the wafer constituting an object of polishing, the above-described wafer is prepared. Further, there is prepared a carrier for holding the wafer, in which the holding hole includes the opening in the circular shape, and the curvature of the circular shape of the opening is equal to or smaller than the smallest curvature of the curvatures of the corner portions of the wafer. Further, before the polishing step, the carrier is set to the lower surface plate, and the wafer constituting the object of polishing is stored to the holding portion of the carrier to be held thereby.

When the carrier and the wafer are set in this way, in order to carry out the polishing step, first, the upper surface plate is moved down, and the both faces of the wafer contained at inside of the holding hole of the carrier are squeezed by the upper surface plate and the lower surface plate while applying a predetermined load thereto.

Next, the wafer is adjusted to a predetermined thickness by polishing the both faces of the wafer by the two surface plates while supplying the polishing solution from the polishing solution supplying means.

At this occasion, the corner portion of the wafer is constituted by the shape of the curved face as described above, and therefore, in polishing, even when impacted or rubbed to the inner peripheral face of the holding hole of the carrier, a breakage of a crack or a chip off at the corner portion of the wafer, that is, the curved face portion can be prevented since a curvature of the circular shape of the opening is the same as or smaller than the smallest curvature of the curvatures of the corner portion of the wafer.

That is, when the corner portion constituting the curved face portion is brought into contact with an inner peripheral face of the circular opening of the holding hole of the carrier, not point (line) contact but substantially face contact is constituted, and therefore, the large load (impact) is not applied locally and the load is dispersed. Therefore, a breakage of a crack of a chip off brought about by the large local load can be prevented.

Further, in the wafer polishing apparatus according to the invention, in the above-described wafer polishing apparatus of the invention, it is preferable that the curvature of the circular shape of the opening of the holding hole of the carrier is constituted by a size equal to or smaller than the smallest curvature of the curvatures of the corner portions of the wafer by 100% and equal to or larger than the smallest curvature by 90%.

Further, according to the wafer polishing method of the invention, in the above-described wafer polishing method of invention, it is preferable that the carrier, in which the curvature of the circular plate of the opening of the holding hole is constituted by a size equal to or smaller than the smallest curvature of the curvatures of the corner portions of the wafer by 100% and equal to or larger than the smallest curvature by 90% is used.

When constituted in this way, the curvature of the corner portion of the wafer becomes equal to or larger than the curvature of the inner peripheral face of the holding hole and sufficiently near to the curvature of the inner peripheral face, and therefore, when the corner portion constituting the curved face portion of the wafer is brought into contact with the inner peripheral face of the holding hole of the carrier, the contact becomes further near to face contact. Therefore, the load can be dispersed more excellently, thereby, a breakage of a crack or chip off by the large local load can firmly be prevented.

Further, a method of forming a piezoelectric vibrator according to the invention is a method of fabricating a plurality of piezoelectric vibrators at a time utilizing a wafer polished by the wafer polishing method comprising an outer shape forming step of patterning outer shapes of the plurality of piezoelectric vibrating pieces to the wafer by etching the wafer as polished by a photolithography technology, an electrode forming step of respectively forming an exciting electrode of vibrating the piezoelectric vibrating piece when a predetermined voltage is applied thereto, and a mount electrode electrically connected to the exciting electrode by way of a leadout electrode by patterning an electrode film on outer surfaces of the plurality of piezoelectric vibrating pieces, a cutting step of cutting to separate the plurality of piezoelectric vibrating pieces from the wafer to fragment, a mount step of bonding the mount electrode of the fragmented piezoelectric vibrating piece to other end side of an external connecting terminal one end side of which is electrically connected to outside after the cutting step, and a sealing step of sealing the piezoelectric vibrating piece in airtight by a sealing member after the mount step.

In the method of fabricating the piezoelectric vibrator according to the invention, there is carried out the outer shape forming step of patterning the outer shapes of the plurality of piezoelectric vibrating pieces to the wafer by etching the wafer the both faces of which are polished by the wafer polishing method and which is adjusted highly accurately to the predetermined thickness by the photolithography technology.

Successively, there is carried out the electrode forming step of respectively forming the respective electrodes of the exciting electrode, the leadout electrode and the mount electrode by patterning an electrode film on the outer surfaces of the plurality of piezoelectric vibrating pieces. Further, there is carried out the cutting step of cutting to separate the plurality of piezoelectric vibrating pieces from the wafer to fragment. Thereby, the plurality of piezoelectric vibrating pieces formed with the exciting electrodes, the leadout electrodes and the mount electrodes on the outer surfaces can be fabricated at a time from the wafer adjusted to the predetermined thickness.

Successively, there is carried out the mount step of connecting the mount electrode of the fragmented piezoelectric vibrating piece to the other end side of the external connecting terminal one end side of which is connected electrically to the outside. Thereby, the piezoelectric vibrating piece is brought into a state of being mechanically supported by and electrically connected to the external connecting terminal. Further, finally, there is carried out the sealing step of sealing the mounted piezoelectric vibrating piece to inside in airtight by the sealing member. As a result, the piezoelectric vibrator in which the piezoelectric vibrating piece is sealed in airtight can be provided.

When the piezoelectric vibrator fabricated in this way is operated, a predetermined voltage is applied to the one end side of the external portion connecting terminal. Thereby, current can be made to flow to the exciting electrode by way of the mount electrode and the leadout electrode, and the piezoelectric vibrating piece can be vibrated by a predetermined frequency.

According to the method of fabricating the piezoelectric vibrator in this way, by the above-described wafer polishing method, in the state of preventing a breakage of a crack or a chip off, the excellently polished wafer is utilized, and therefore, when viewed from a total of the fabricating step, yield can be promoted by improving a productivity, and therefore, a reduction in production cost can be achieved.

Further, according to the wafer, it can be identified easily where the reference face of the crystal orientation of the raw material is, and therefore, in the outer shape forming step of patterning the outer shape of the piezoelectric vibrating piece to the wafer, positioning or the like of the mask becomes easy.

Further, the piezoelectric vibrator according to the invention is fabricated by the method of fabricating the piezoelectric vibrator of the invention.

According to a piezoelectric vibrator of the invention, the piezoelectric vibrator is fabricated by the above-described fabricating method, and therefore, production cost is reduced in comparison with that of the background art.

Further, according to an oscillator of the invention, the piezoelectric vibrator of the invention is electrically connected to an integrated circuit of the oscillating piece.

Further, according to an electronic apparatus of the invention, the piezoelectric vibrator of the invention is electrically connected to a time counting portion.

Further, according to a radiowave timepiece of the invention, the piezoelectric vibrator of the invention is electrically connected to a filter portion.

In the oscillator, the electronic apparatus and the radiowave timepiece according to the invention, the above-described piezoelectric vibrator is provided, and therefore, the production cost is reduced in comparison with that of the background art.

According to the wafer of the invention, a breakage of a crack or a chip off in polishing is prevented, and therefore, yield is promoted by improving a productivity and a reduction in production cost is achieved. Further, a breakage of a crack or a chip off is prevented, and therefore, large-sized formation and thin thickness formation can also be carried out.

According to the wafer polishing apparatus and the wafer polishing method of the invention, a breakage of a crack or a chip off at the corner portion, that is, the curved face portion of the wafer can be prevented, and therefore, yield can be promoted by improving a productivity and production cost can be reduced.

Further, according to the method of fabricating the piezoelectric vibrating piece of the invention, the wafer polished by the above-described wafer polishing method is utilized, and therefore, when viewed in a total of fabricating steps, a reduction in production cost can be achieved.

Further, according to the piezoelectric vibrator of the invention, the piezoelectric vibrator is fabricated by the above-described fabricating method, and therefore, production cost is reduced in comparison with that of the background art.

Further, according to the oscillator, electronic apparatus and the radiowave timepiece of the invention, the piezoelectric vibrator is provided, and therefore, production cost is reduced in comparison with that of the background art.

DETAILED DESCRIPTION OF THE PREFERRED EMBODIMENTS

An embodiment according to a piezoelectric vibrator according to the invention will be explained in reference to FIG. 1 through FIG. 19 as follows. Further, according to the embodiment, an explanation will be given by taking an example of a piezoelectric vibrator of a cylinder package type as a piezoelectric vibrator 1.

As shown by FIG. 1 through FIG. 4, the piezoelectric vibrator 1 of the embodiment includes a piezoelectric vibrating piece 2, a case 3 of containing the piezoelectric vibrating piece 2 at inside thereof, and a plug 4 constituting an airtight terminal of hermetically closing the piezoelectric piece 2 at inside of the case 3.

Figure 2:
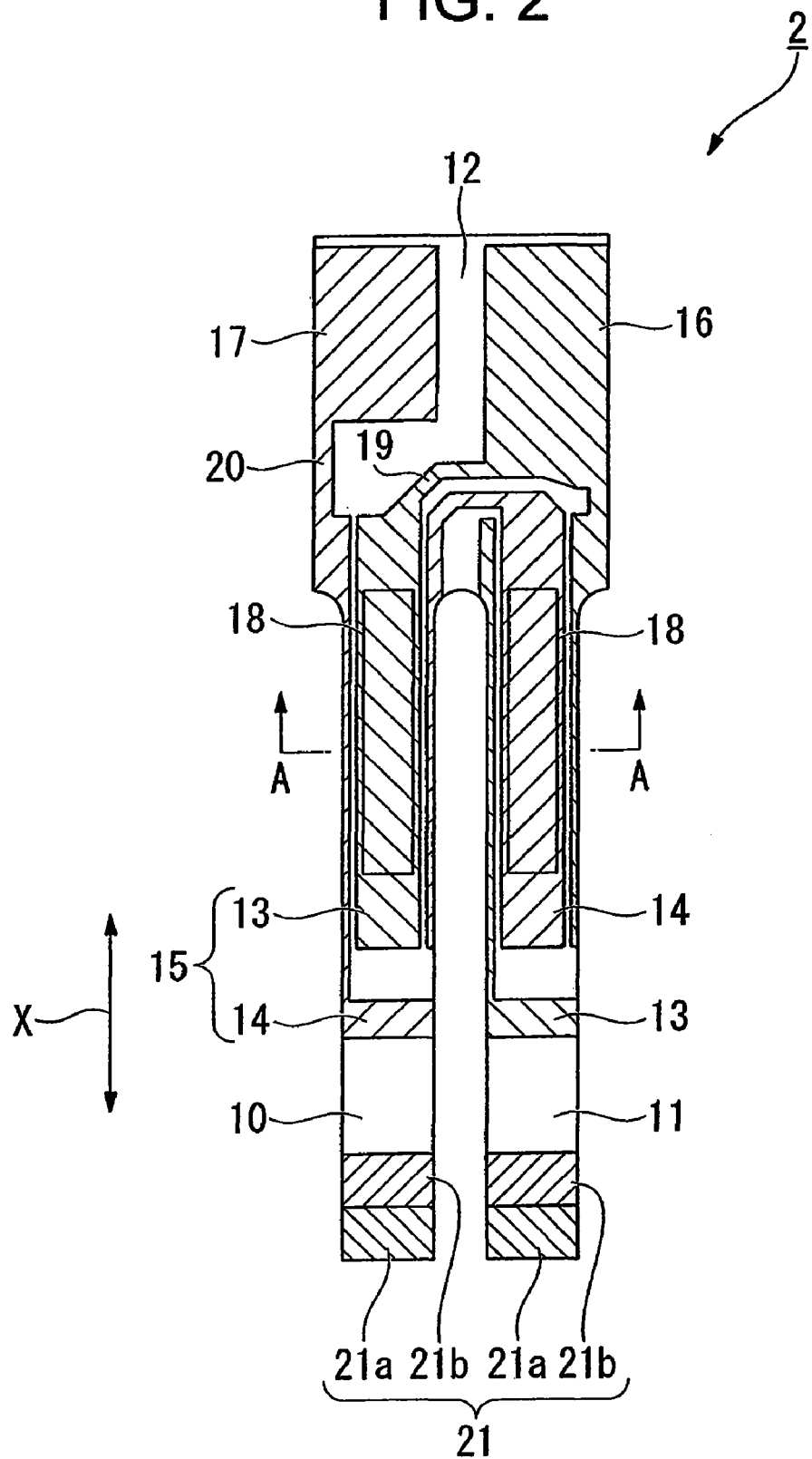
FIG. 2 is a view viewing a piezoelectric vibrating piece constituting the piezoelectric vibrator shown in FIG. 1 from an upper face.
Figure 3:
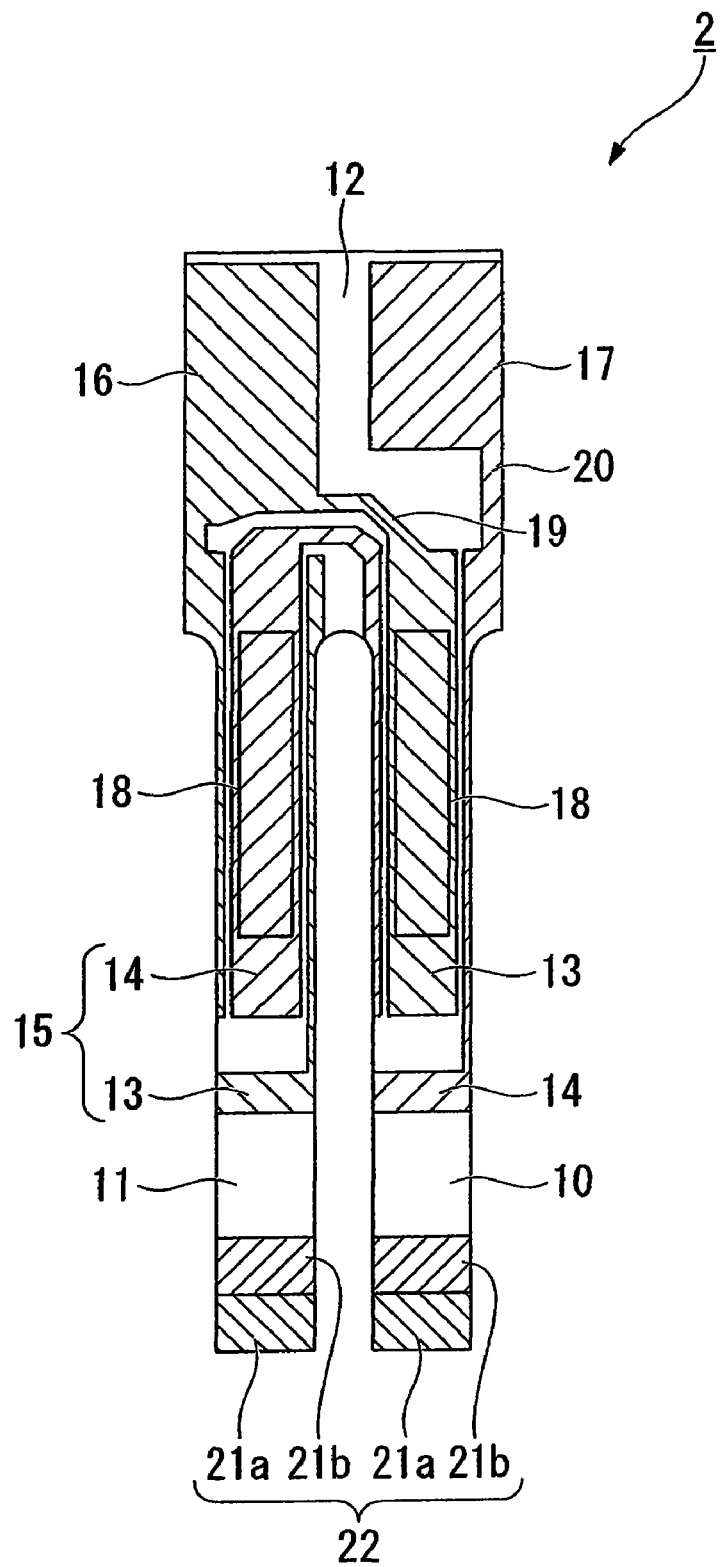
FIG. 3 is a view viewing the piezoelectric vibrating piece constituting the piezoelectric vibrator shown in FIG. 1 from a lower face.

As shown by FIG. 2 and FIG. 3, the piezoelectric vibrating piece 2 is a vibrating piece of a tuning fork type formed by a piezoelectric material of quartz, lithium tantalite, lithium niobate or the like and is vibrated when a predetermined voltage is applied thereto. Further, the piezoelectric vibrating piece 2 is fabricated from the wafer S mentioned later.

The piezoelectric vibrating piece 2 includes a pair of vibrating arm portions 10, 11 arranged in parallel, a base portion 12 integrally fixing base end sides of the pair of vibrating arm portions 10, 11, and an exciting electrode 15 including a first exciting electrode 13 and a second exciting electrode 14 formed on outer surfaces of the pair of vibrating arm portions 10, 11 for vibrating the pair of vibrating arm portions 10, 11, and mount electrodes 16, 17 electrically connected to the first exciting electrode 13 and the second exciting electrode 14.

Further, the piezoelectric vibrating piece 2 of the embodiment includes groove portions 18 respectively formed on both main faces of the pair of vibrating arm portions 10, 11 along a longitudinal direction X of the vibrating arm portions 10, 11. The groove portions 18 are formed from base end sides of the vibrating arm portions 10, 11 to vicinities of substantially middles thereof.

Figure 4:
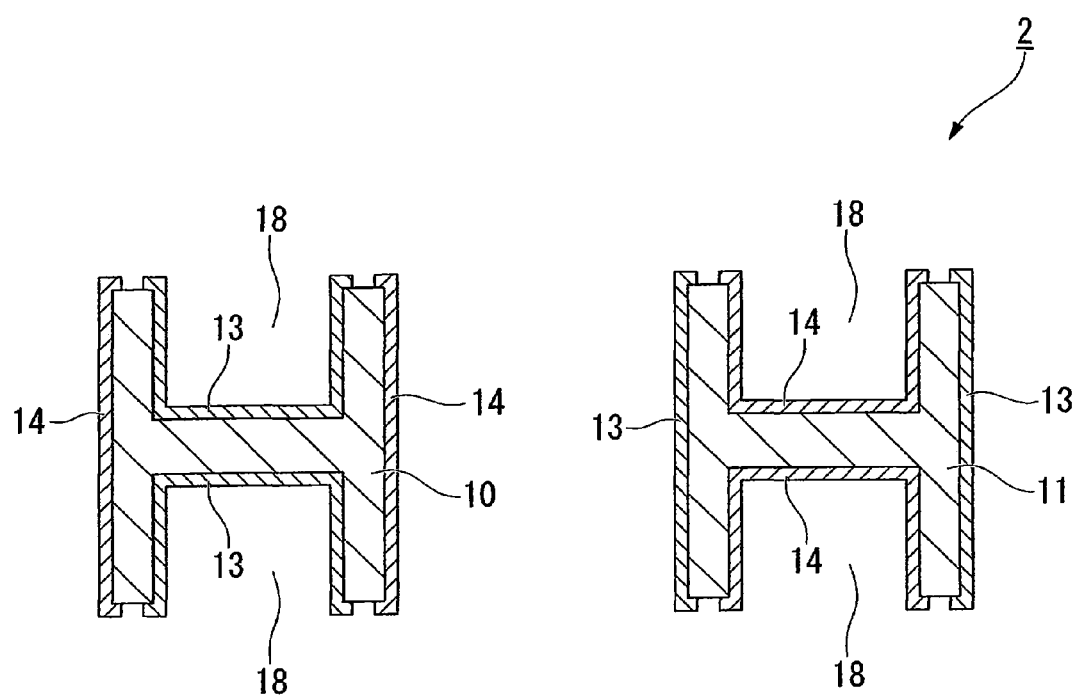
FIG. 4 is a sectional view taken along a line A-A of FIG. 2.

The exciting electrode 15 including the first exciting electrode 13 and the second exciting electrode 14 is an electrode of vibrating the pair of vibrating arm portions 10, 11 in directions of being proximate to and remote from each other by a predetermined resonance frequency, and formed by being patterned on the outer surfaces of the pair of vibrating arm portions 10, 11 in a state of being respectively electrically cut to separate. Specifically, as shown by FIG. 4, the first exciting electrode 13 is mainly formed on the groove portion 18 of the vibrating arm portion 10 on one side and on side faces of the vibrating arm portion 11 on other side and the second exciting electrode 14 is formed mainly on both side faces of the vibrating arm portion 10 on one side and on the groove portion 18 of the vibrating arm portion 11 on other side.

As shown by FIG. 2 and FIG. 3, the first exciting electrode 13 and the second exciting electrode 14 are electrically connected to the mount electrodes 16, 17 respectively by way of leadout electrodes 19, 20 on both main faces of the base portion 12. Further, the piezoelectric vibrating piece 2 is applied with a voltage by way of the mount electrodes 16, 17.

Further, the exciting electrode 15, the mount electrodes 16, 17, the leadout electrodes 19, 20 mentioned above are formed by coating a conductive film (electrode film) of, for example, chromium (Cr), nickel (Ni), aluminum (Al) or titanium (Ti) or the like.

Further, front ends of the pair of vibrating arm portions 10, 11 are coated with weight metal films 21 to adjust (frequency adjustment) a vibrating state of their own to vibrate within a predetermined range of a frequency. Further, the weight metal film 21 is divided into a rough adjusting film 21a used for roughly adjusting the frequency and a fine adjusting film 21b used in adjusting the frequency finely. By carrying out the frequency adjustment by utilizing the rough adjusting film 21a and the fine adjusting film 21b, the frequency of the pair of vibrating arm portions 10, 11 can be confined within a range of a nominal frequency of a device.

Figure 1:
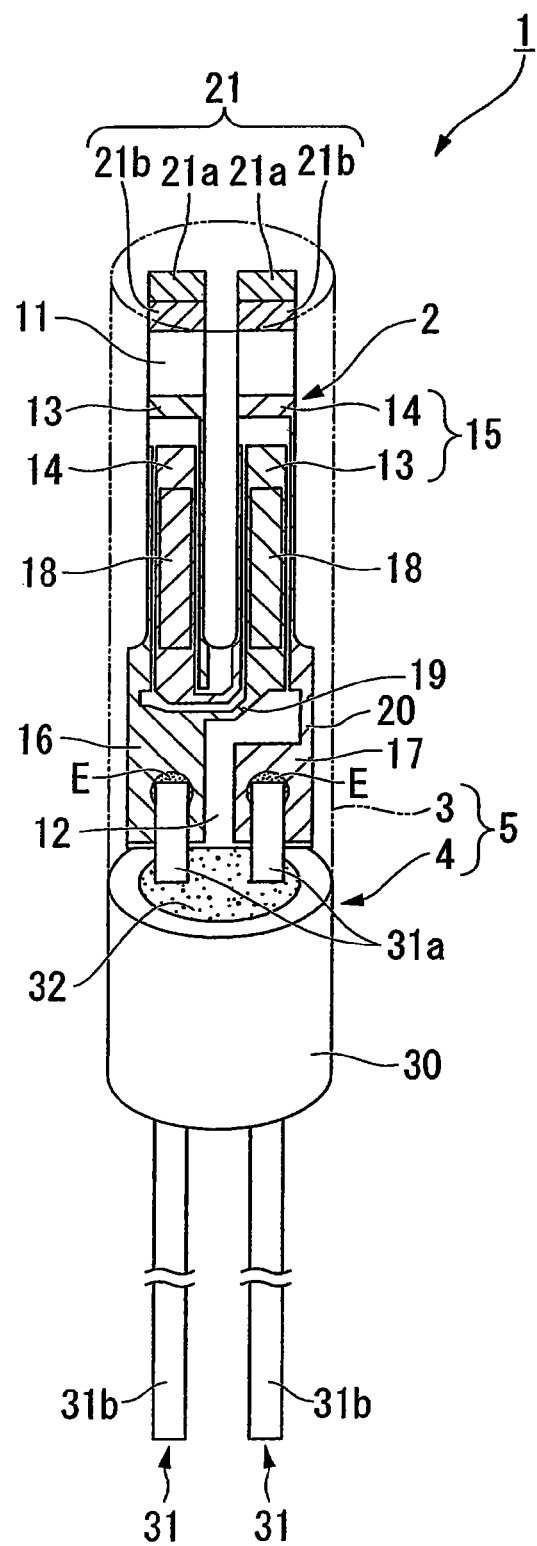
FIG. 1 is a view showing an embodiment of a piezoelectric vibrator according to the invention and is a total view viewed from an upper face side.

As shown by FIG. 1, the case 1 is formed in a shape of a bottomed circular cylinder and is press-fit to be fitted to be fixed to an outer periphery of a stem 30 mentioned later of the plug 4 in a state of containing the piezoelectric vibrating piece 2 at inside thereof. Further, the case 3 is press-fit under a vacuum atmosphere, thereby, a space surrounding the piezoelectric vibrating piece 2 at inside of the case 3 is brought into a state of being maintained in vacuum.

The plug 4 includes the stem 30 of hermetically closing the case 3, 2 pieces of lead terminals 31 which are arranged in parallel to penetrate the stem 30 and one end sides of which are constituted as inner leads 31a of mounting (mechanical bonding and electrically connecting) the piezoelectric vibrating piece 2 by interposing the stem 30 therebetween and other end sides of which are constituted as outer leads 31b electrically connected to outside, and an insulating filling member 32 filled on an inner side of the stem 30 for fixing the stem 30 and the lead terminal 31.

The stem 30 is formed in a ring-like shape by a metal material. Further, as a material of the filling member 32, for example, borosilicate glass is used. Further, a surface of the lead terminal 31 and an outer periphery of the stem 30 are coated with plating, not illustrated, respectively of the same material.

Portions of 2 pieces of the lead terminals 31 projected to inside of the case 3 are made to constitute the inner leads 31a and portions thereof projected to outside of the case 3 are made to constitute the outer leads 31b. Further, the inner leads 31a and the mount electrodes 16, 17 are mounted by way of conductive bumps E. That is, the inner leads 31a and the mount electrodes 16, 17 are mechanically bonded, at the same time, electrically connected by way of the bumps E. As a result, the piezoelectric piece 2 is brought into a state of being mounted to 2 pieces of the lead terminals 31.

Further, 2 pieces of the lead terminals 31 mentioned above are made to function as an external portion connecting terminals one end sides (sides of outer leads 31b) are electrically connected to outside and other end sides (sides of inner leads 31a) of which are mounted to the piezoelectric vibrating piece 2. Further, the case 3 and the plug 4 are made to function as a sealing member 5 for sealing the mounted piezoelectric vibrating piece 2 at inside in airtight.

Here, examples of dimensions and materials of principal parts constituting the plug 4 will be described.

A diameter of the lead terminal 31 is, for example, about 0.12 mm, and as a material of a base member of the lead terminal 31, kovar (FeNiCo alloy) is commonly used. Further, as a material of plating coated on the outer surface of the lead terminal 31 and the outer periphery of the stem 30, Cu is used as a matrix metal film, and as a finish metal film, heat resistant solder plating (alloy of tin and lead, a weight ratio thereof is 1:9), silver (Ag), tin copper alloy (SnCu), gold tin alloy (AuSn) or the like is used. Further, inside of the case 3 can be sealed in airtight in a vacuum state by carrying out cold pressure welding in vacuum at an inner periphery of the case 3 while interposing a coated metal film (plating layer) at the outer periphery of the stem 30.

When the piezoelectric vibrator 1 constituted in this way is operated, a predetermined drive voltage is applied to the outer leads 31b of 2 pieces of the lead terminals 31. Thereby, a current can be made to flow to the exciting electrode 15 including the first exciting electrode 13 and the second exciting electrode 14 by way of the inner leads 31a, the bumps E, the mount electrodes 16, 17 and the leadout electrodes 19, 20, and the pair of vibrating arm portions 10, 11 can be vibrated in directions of being proximate to or remote from each other by the predetermined frequency. Further, by utilizing the vibration of the pair of vibrating arm portions 10, 11, the vibration can be utilized as a timing source, a reference signal source or the like of a time source, a control signal.

Next, a method of fabricating the piezoelectric vibrating piece 1 mentioned above will be explained as follows, prior thereto, an explanation will be given of the wafer S according to the invention used as a raw material of the piezoelectric vibrating piece 2.

Figure 5:
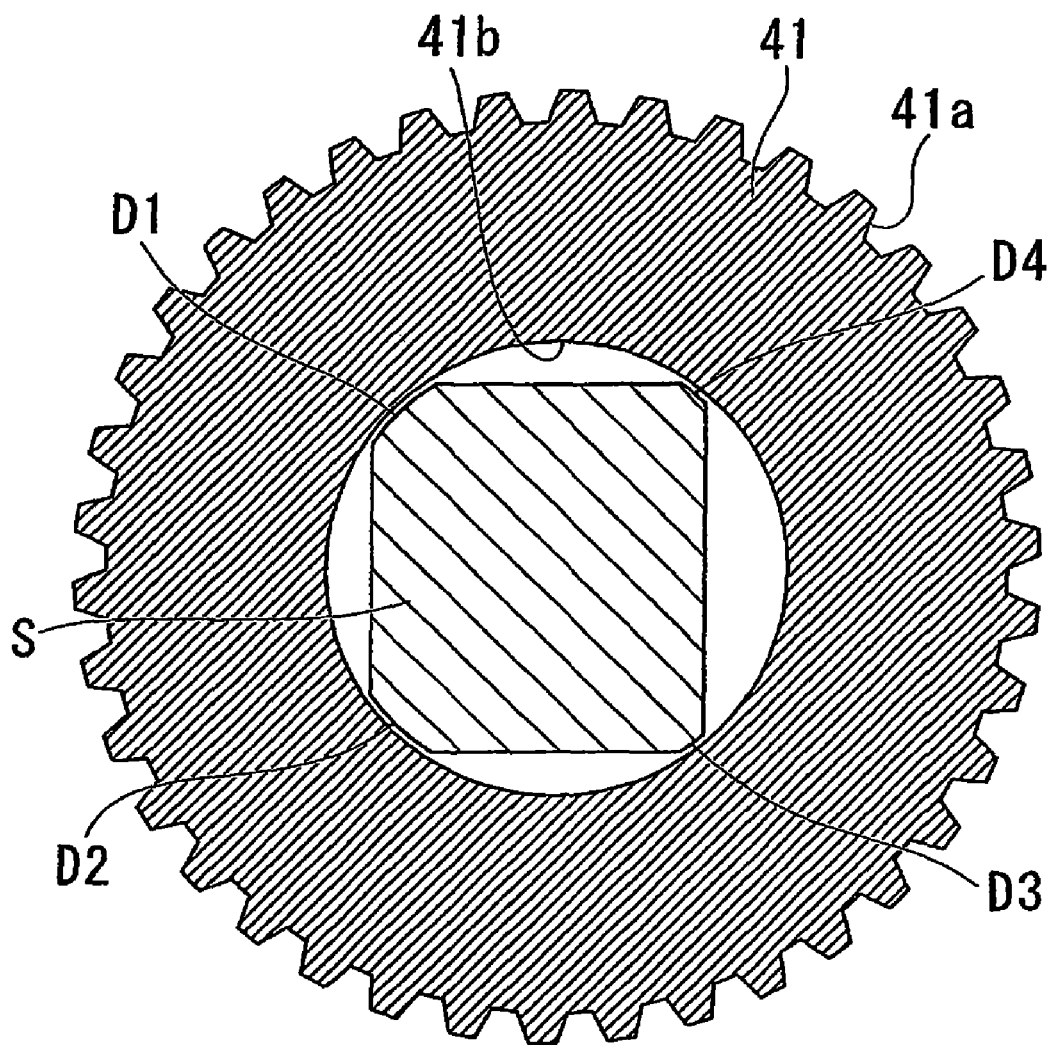
FIG. 5 is a plane view showing a wafer according to the invention and a carrier according to the invention for holding the wafer.

FIG. 5 is a view showing an embodiment of a wafer according to the invention. In FIG. 5, the wafer S is brought into a state of being held by a holding hole 41b of a carrier 41 according to the invention. The wafer S is a plate-like member substantially in a rectangular shape, and all of four corner portions thereof are formed in shapes of curved faces by chamfering providing curvatures, that is, R chamfering.

Among the four corner portions, two corner portions D1, D2 contiguous to each other in long side directions are made to constitute first curved face portions having the same curvature, and other two corner portions D3, D4 are made to constitute second curved face portions having the same curvature. The first curved face portions (corner portion D1, corner portion D2) and the second curved face portions (corner portion D3, corner portion D4) are formed by curvatures different from each other or formed by the same curvature, and according to the embodiment, formed by the same curvature. That is, a curvature of the first curved face portion is formed to be the same as or smaller than a curvature R2 of the second curved face portion. (According to the embodiment, the curvature R1 is formed to the same as the curvature R2.)

Further, although according to the embodiment, the first curved face portion and the second curved face portion are provided with the same curvature, lengths of curved portions when viewed planely, that is, lengths of circular arc portions when viewed planely are formed to differ from each other. (According to the embodiment, the first curved face portion is made to be longer than the second curved face portion.) By such a constitution, the first curved face portion and the second curved face portion can easily be optically recognized to be different from each other, and therefore, the first curved face portion and the second curved face portion can easily be identified.

Further, the curvature R is defined by (1/r; where, r is a radius of a circle), and therefore, the curvature R1 of the first curved face portion becomes (1/r1) and the curvature R2 of the second curved face portion becomes (1/r2). That is, $R1 \leq R2$, that is, $r1 \geq r2$.

Here, a piezoelectric member of quartz or the like constituting the wafer S is provided with a reference face constituted by including an angle determined with regard to a predetermined face based on a crystal thereof in working the piezoelectric member into a piezoelectric vibrating piece as described above, normally, it is necessary to constitute the reference face as an end face of the wafer. Hence, in the wafer S of the embodiment, particularly, an end face between the first curved portions, that is, an end face between the corner portion D1 and the corner portion D2 is made to constitute the reference face.

On the other hand, the carrier 41 according to the invention is constituted by a ring-like member constituting an outer edge thereof by a gear portion 41a, having the holding hole 41b at inside thereof and provided with a thickness sufficiently thinner than the wafer S. According to the holding hole 41b, a shape of an opening thereof is formed in a circular shape, in order to hold the wafer S with a play, a diameter thereof is formed to be slightly larger than the longest side of the wafer S. Further, a curvature R3 of the opening of the holding hole 41b is made to be the same or smaller than the smallest curvature R1 of curvatures (R1, R2) of the corner portions D1 through D4 of the wafer S. That is, $R3 \leq R1 (R2)$ is established.

Under such a constitution, when the wafer S is polished by being held by the holding hole 41b of the carrier 41 as mentioned later, a breakage of a crack or a chip off at the corner portions D1 through D4 is prevented. That is, when the corner portions D1 through D4 constituting the curved face portions are brought into contact with inner peripheral faces of a circular opening of the holding hole 41b of the carrier 41, not point (line) contact but substantially face contact is constituted, and therefore, a large load (impact) is not locally applied, the load is dispersed. Therefore, a breakage of a crack or a chip off brought about by the locally large load can be prevented.

Further, the end face between the first curved face portions constitutes the reference face, and therefore, the reference face can easily be identified even after polishing.

Figure 6:
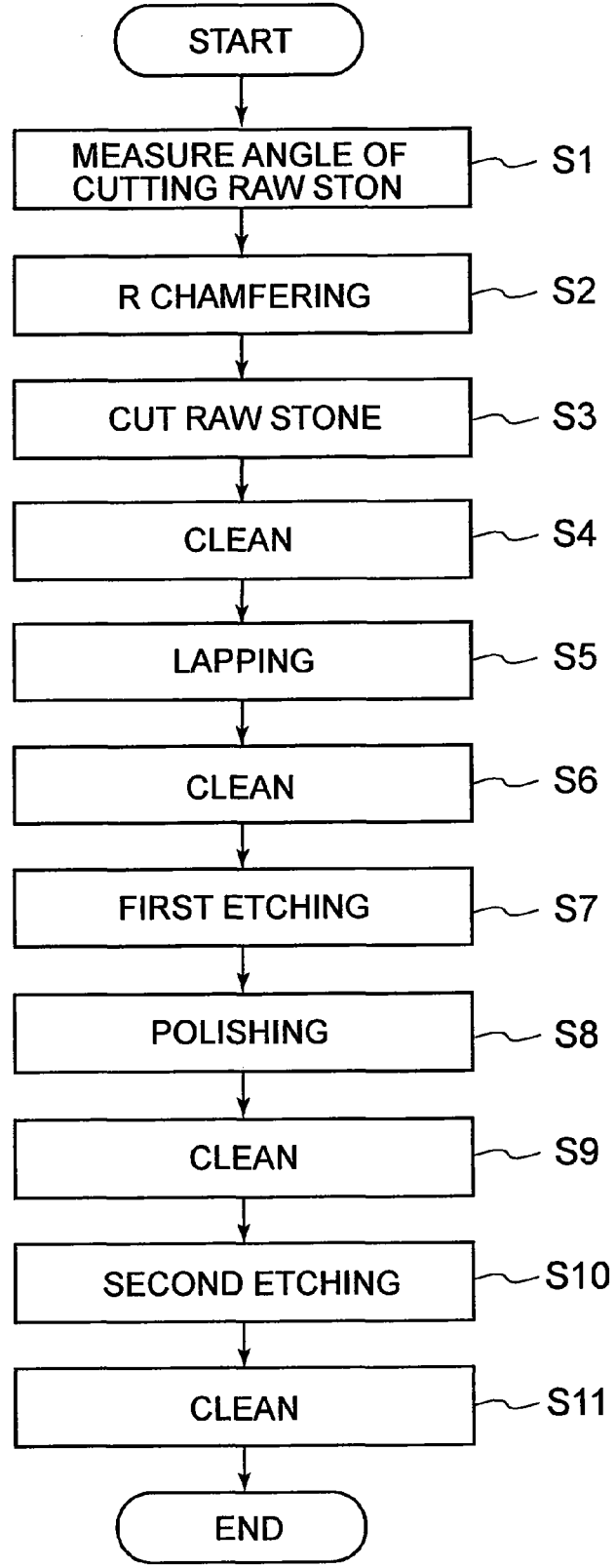
FIG. 6 is a flowchart showing a flow in fabricating a wafer constituting a bace of the piezoelectric vibrating piece shown in FIG. 2.

Next, a method of fabricating the piezoelectric vibrator 1 including the fabrication of the wafer S shown in FIG. 5 will be explained in reference to a flowchart shown in FIG. 6.

In steps of fabricating the wafer S, first, a raw stone is worked to R chamfering and the raw stone is cut to constitute the wafer S in a predetermined thickness. That is, a raw stone in a prism shape having a cross-sectional face in a rectangular shape is prepared and an angle of cutting the raw stone (cut angle) is measured by X-ray diffraction method or the like (S1). In details, the cut angle is measured by using X-ray to constitute an angle around X axis of Z face of the raw stone by the designated angle. After having been measured, the raw stone is fixed onto glass constituting a base by using an adhering agent. Further, according to the embodiment, quartz is used as the raw stone and a reference face of the quartz is made to constitute the end face of the wafer formed.

Successively, the corner portion of the raw stone is worked to R chamfering by polishing and all of four corner portions of the rectangle constituting a cross-sectional face is constituted by a curved face shape (S2). The polishing method is carried out by rotating the raw stone and rubbing the corner portion by a polishing member of suede or the like. At that occasion, R chamfering is carried out by polishing the raw stone such that a rotating axis of the raw stone is rotated by being shifted to the side of the one long side from a center axis and polishing the raw stone such that the corner portion on the side of the long side remote from the rotating axis and the corner portion on the side proximate thereto constitute the same curvature and the lengths of the curved portions (lengths of circular arc portions) in a plane view differ from each other. However, the rotating axis in the polishing is set such that the long side between the corner portions (D1, D2) on the side of being remote from the rotating axis, and therefore, prolonging the length of the curved portion constitute the reference face mentioned above.

Next, the raw stone the corner portion of which is subjected to the R chamfering is set to a work table of a wire saw. Further, the raw stone is cut by a thickness of about 220 µm by using a wire saw (for example, high tension wire having a wire diameter of about 160 µm) to constitute the wafer substantially in the rectangular shape (S3).

Further, according to the embodiment, a maximum length of the wafer S formed is constituted by about 95 mm. Further, in the cutting, a feed speed of the wire saw is controlled to 40 mm through 50 mm per minute. Further, as a cutting solution, a solution of blending a pertinent amount of lapping oil to a polishing grain is used. As the polishing grain, silicon carbide (SiC) having a mean particle size of about 12 µm is commonly used. Further, a temperature of the cutting solution is controlled to maintain normal temperature.

Next, a side of a face of the wafer S is polished (S4). That is, an outer peripheral face of the cut wafer S is polished wafer by wafer, or a plurality of the wafers S are overlapped to paste together by an adhering agent to constitute a block, thereafter, the outer periphery is polished by a polisher, not illustrated. Thereby, a crack, a chip off or the like of the wafer S can be restrained from being brought about by smoothly finishing the outer periphery. Particularly, in the case of the wafer S in the rectangular shape of the embodiment, a dimensional accuracy of the outer shape of the wafer S can be constituted. After polishing, the adhering agent is dissolved by heating or the like to separate into the single wafers S. Further, the separated wafer is subjected to ultrasonic cleaning in a cleaning solution to completely remove the adhering agent.

Figure 7:
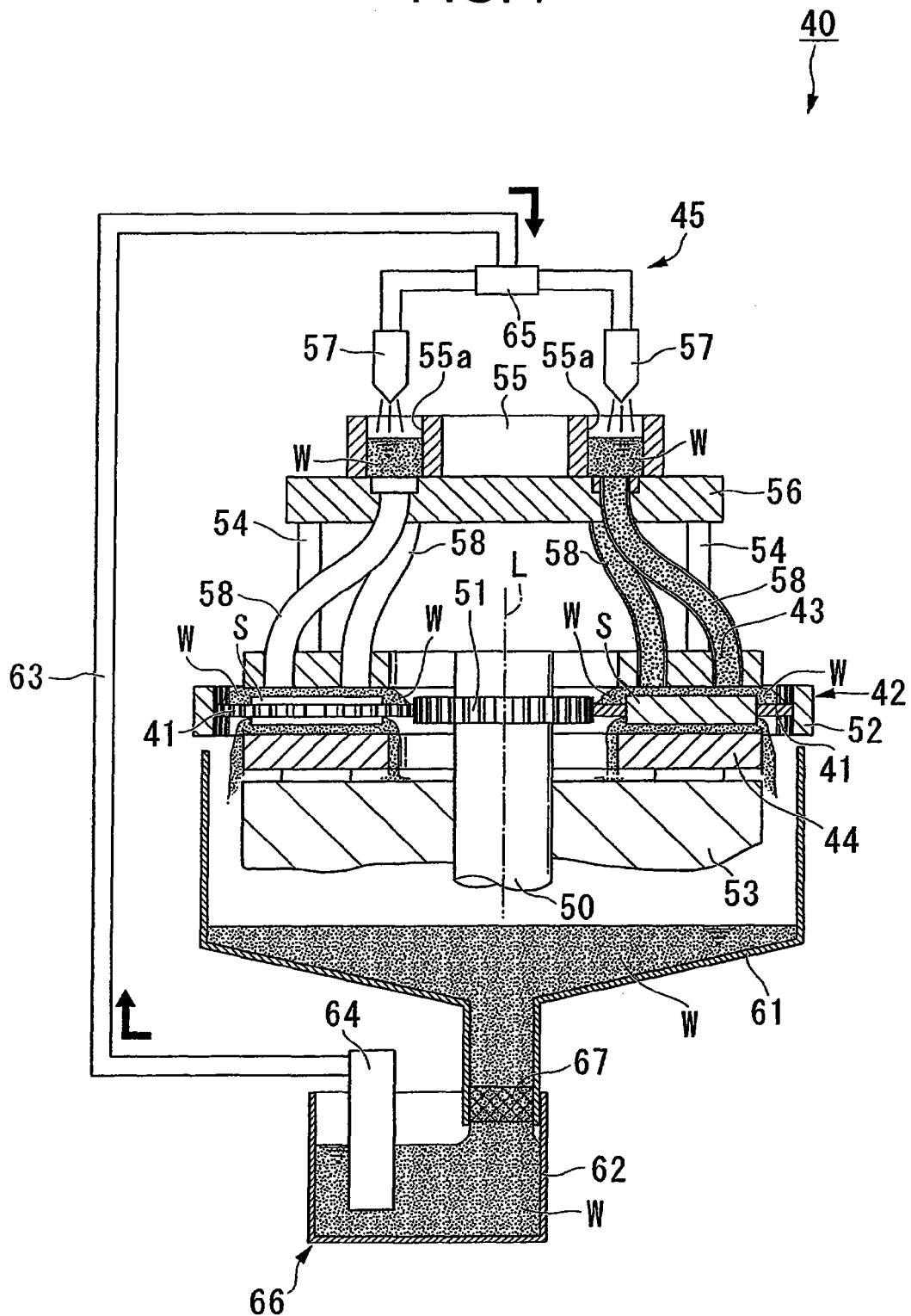
FIG. 7 is a constitution view of a wafer polishing apparatus according to the invention.
Figure 28:
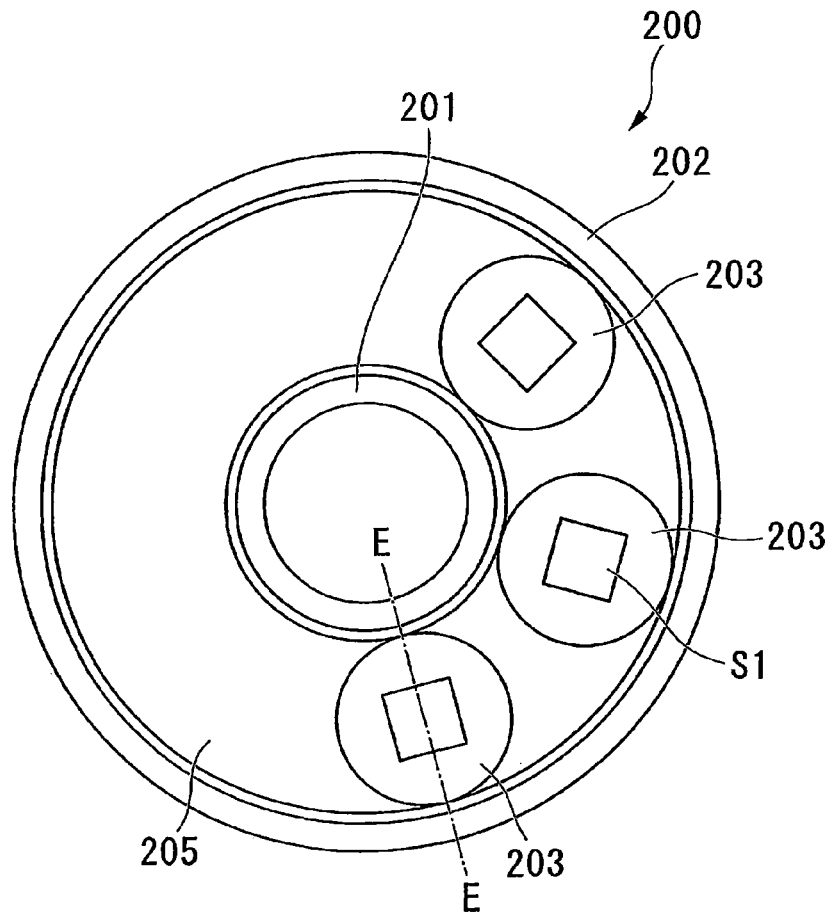
FIG. 28 is a constitution view showing an example of a polishing apparatus of a background art.
Figure 29:
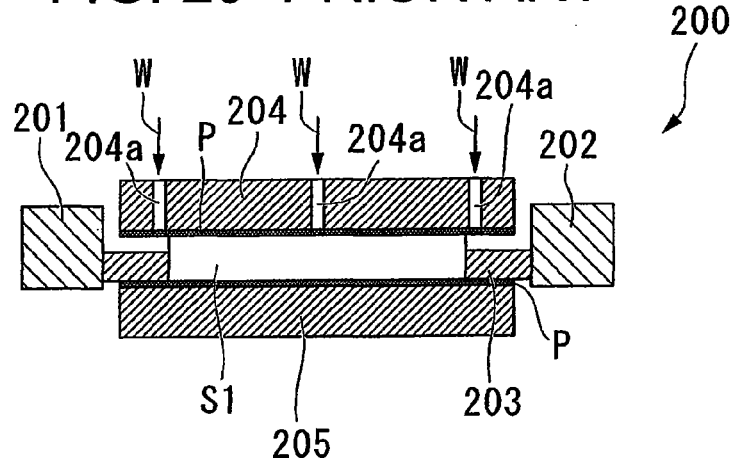
FIG. 29 is a sectional view taken along a line E-E of FIG. 28.
Figure 30:
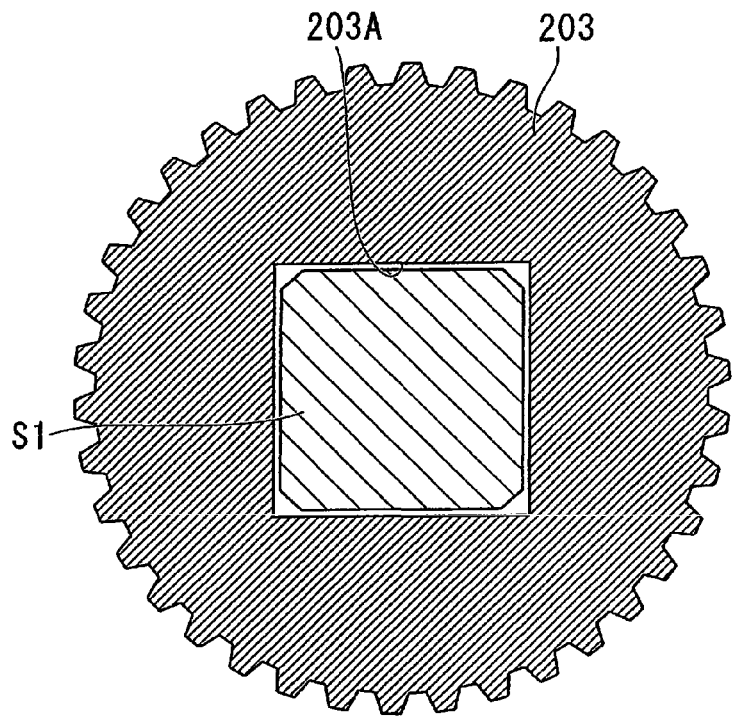
FIG. 30 is a plane view showing a carrier of a background art and a wafer held thereby.

Next, the both faces of the wafer S the side faces of which are polished or lapped (roughly worked) by using a wafer polishing apparatus 40 shown in FIG. 7 to polish to a desired thickness (S5). Here, the wafer polishing apparatus 40 will be explained in details. Further, the wafer polishing apparatus 40 is the same as the polishing apparatus of the background art shown in FIG. 28, FIG. 29, FIG. 31 in a basic constitution thereof, the difference resides in that the carrier 41 shown in FIG. 5 is used in place of the carrier 203 shown in FIG. 30.

Figure 8:
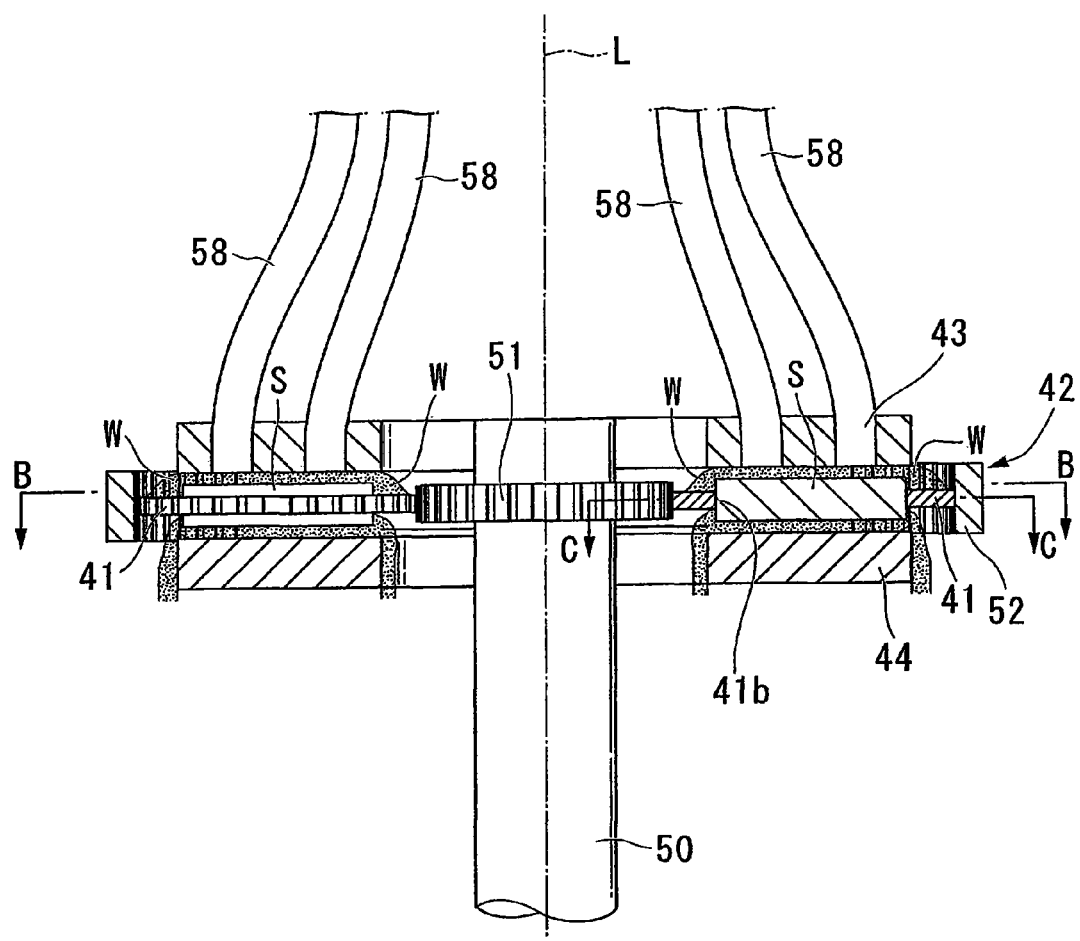
FIG. 8 is a view enlarging a periphery of a carrier constituting the wafer polishing apparatus shown in FIG. 7.

As shown by FIG. 7, FIG. 8, the wafer polishing apparatus 40 is an apparatus of adjusting a thickness of the wafer S to a predetermined thickness by polishing the both faces of the wafer S while supplying the polishing solution W, and is constituted by including the carrier 41, a planetary gear mechanism 42, an upper surface plate 43, a lower surface plate 44, and polishing solution supplying means 45.

According to the carrier 41, as shown by FIG. 5, the outer edge is made to constitute the gear portion 41a, the one holding hole 41b is provided at inside thereof, and the curvature R3 of the circular opening of the holding hole 41b is formed to be the same as or smaller than the smallest curvature R1 (R2) in the curvatures (R1, R2) of the corner portions D1 through D4 of the wafer S. Specifically, the curvature R3 of the holding hole 41b is formed to the size equal to or smaller than the curvature R1 (R2) of the wafer S by 100% and equal to or larger than the curvature R1 (R2) by 90%.

Figure 9:
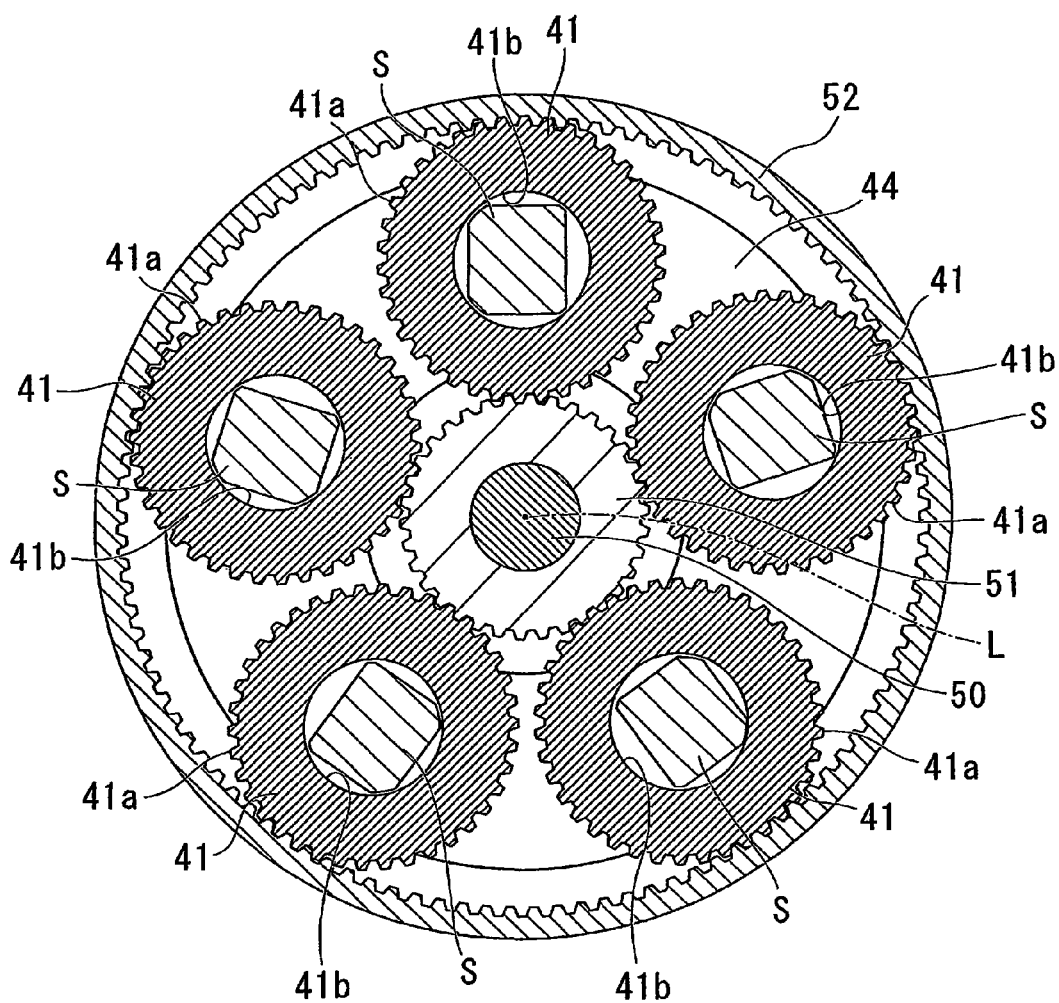
FIG. 9 is a view taken along a line B-B of FIG. 7.
Figure 10:
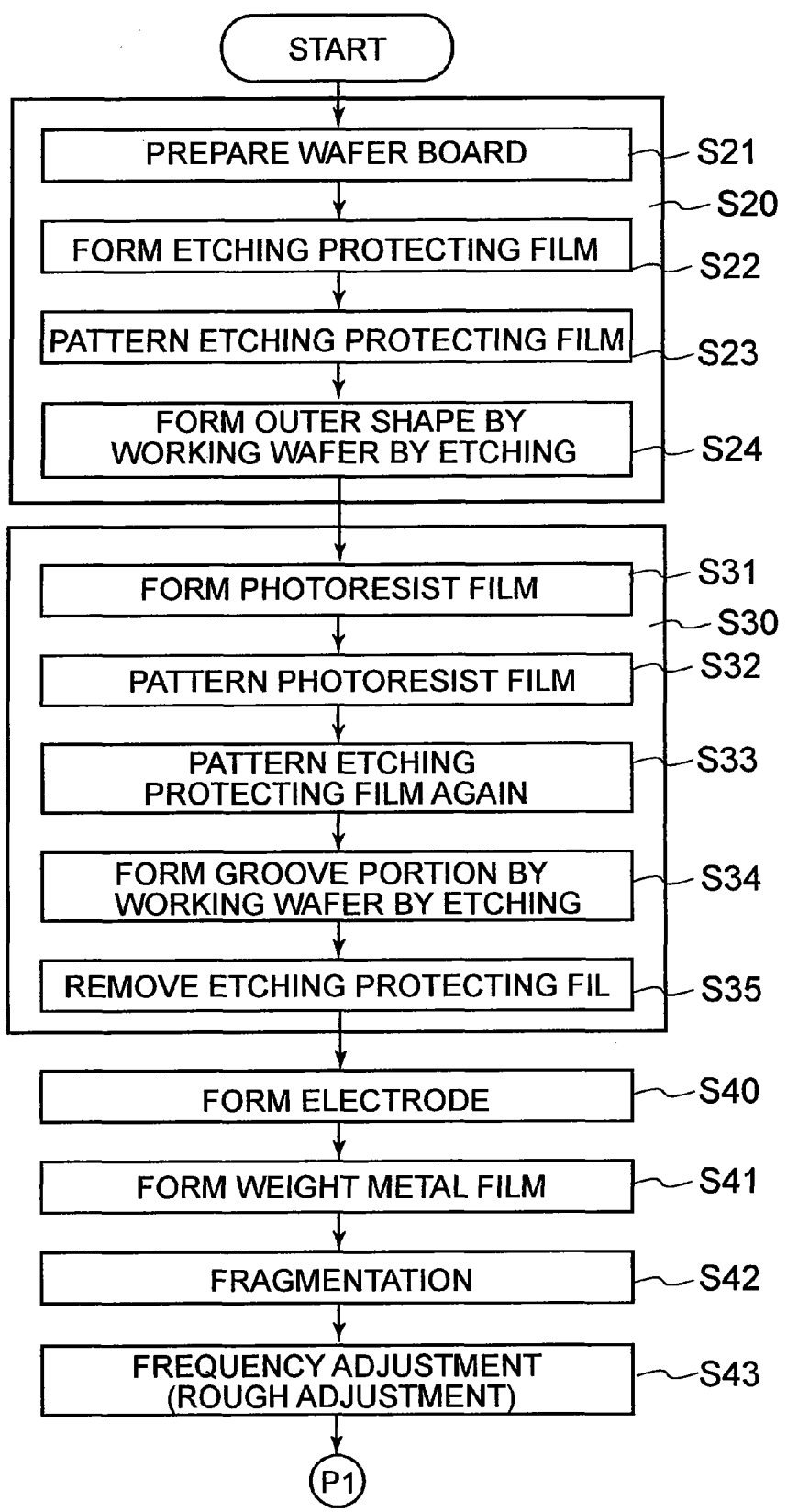
FIG. 10 is a flowchart showing a flow in fabricating the piezoelectric vibrator shown in FIG. 1 by utilizing a polished wafer.
Figure 11:
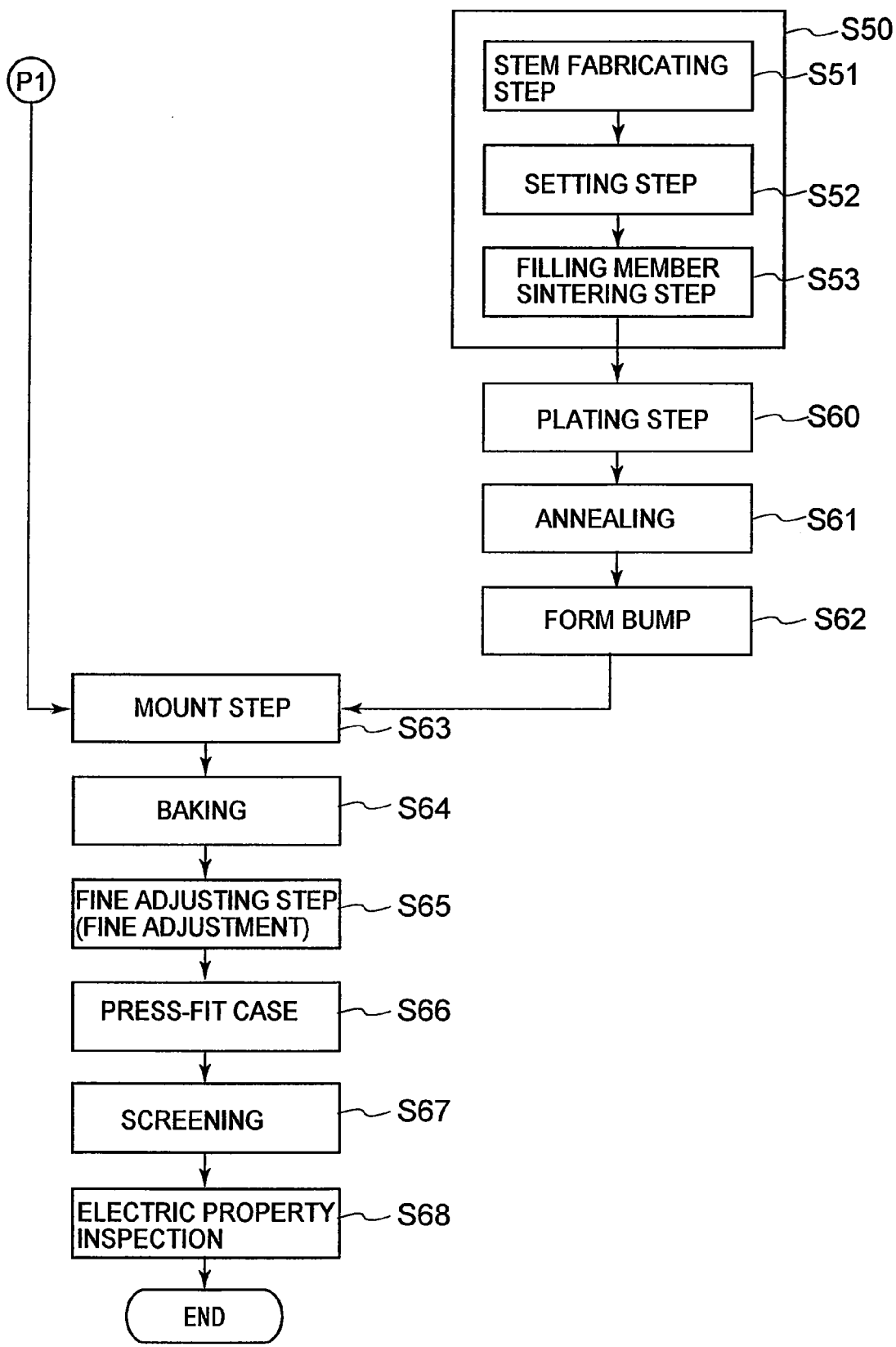
FIG. 11 is a flowchart of a continuation of the flowchart shown in FIG. 10.

Further, according to the embodiment, an explanation will be given such that the wafer polishing apparatus 40 includes 5 sheets of the carriers 41 of the above-described constitution as shown by FIG. 9.

According to the wafer polishing apparatus 40, as shown by FIG. 9, 5 sheets of the carriers 41 are arranged at predetermined angular intervals by constituting a center by an axis line L. Further, a shaft 50 is arranged along the axis line L and the shaft 50 is fixed with a sun gear 51. Further, an internal gear 52 formed in a ring-like shape is arranged to surround surroundings of 5 sheets of the carriers 41. Further, 5 sheets of the carriers 41 are arranged in a state of bringing the gear portion 41a in mesh with the sun gear 51 and the internal gear 52.

Both of the sun gear 51 and the internal gear 52 are rotated in the counterclockwise direction by a drive source, not illustrated. At this occasion, speeds of rotating the sun gear 51 and an internal gear 52 are adjusted to rotate by speeds separate from each other. Thereby, the respective carriers 41 are revolved in the counterclockwise direction centering on the axis line L while being rotated in the clockwise direction. That is, the sun gear 51 and the internal gear 52 are brought in mesh with the carrier 41 by way of the gear portion 41a and made to function as the planetary gear mechanism 42 of revolving the carrier 41 around the axis line L while rotating the carrier 41.

As shown by FIG. 7, FIG. 8, FIG. 9, the upper surface plate 43 and the lower surface plate 44 are formed in a circular plate shape (ring shape) by hollowing centers thereof, and arranged on upper and lower sides of the carrier 41. The lower surface plate 44 is fixed onto a rotating table 53 and is rotated in a direction reverse to a direction of revolving the carrier 41 (clockwise direction) centering on the axis line L along with the rotating table 53. Further, the upper surface plate 43 is made to be movable in an up and down direction along a pole 54 as shown by FIG. 7, and a distance to a lower surface plate 44 is made to be able to be adjusted freely. Thereby, the wafer S is made to be able to be contained in the holding hole 41b formed at the carrier 41, or taken out therefrom, and the wafer S is made to be able to be squeezed by the two surface plate while applying a predetermined load to the wafer S contained to be held in the carrier 41.

The two surface plates 43, 44 are formed by sizes of making a portion of the carrier 41 protrude and be exposed to an outer side from the inner peripheral faces and the outer peripheral faces of the two surface plates 43, 44. Accordingly, as the carrier 41 rotates and revolves, a part of the sun gear 51 and a part of the internal gear 52 are always exposed. Further, although in FIG. 9, only the lower surface plate 44 is illustrated, also the upper surface plate 43 is constituted by a size the same as that of the lower surface plate 44.

Further, as shown by FIG. 7, an upper side of the upper surface plate 43 is arranged with a ring plate 56 fixed with a powder ring 55, and the pole 54 is fixed to a lower face of the ring plate 56. The powder ring 55 is formed with a groove portion 55a in a ring shape, and the polishing solution W delivered from a supply valve 57 arranged on an upper side of the powder ring 55 is made to be able to be stored at an inner portion thereof.

Further, the ring plate 56 is fixed with base end sides of a plurality of powder hoses (supply hoses) 58. At this occasion, the respective powder hoses 58 are fixed in a state of being communicated to inside of the groove portion 55a. Thereby, the polishing solution W temporarily stored at inside of the groove portion 55a is made to flow from the groove portion 55a to inside of the powder hose 58 and flow to a front end of the powder hose 58.

Figure 31:
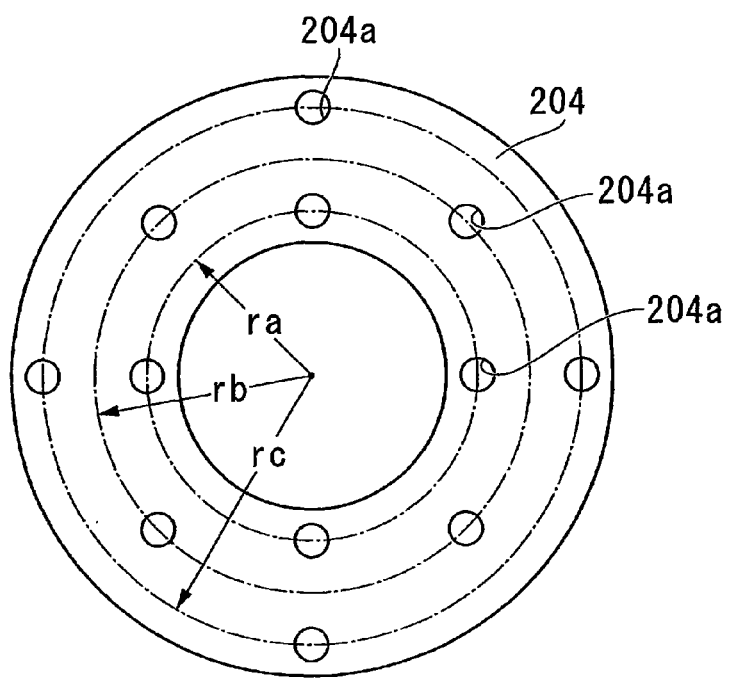
FIG. 31 is a top view of an upper surface plate constituting a polishing apparatus shown in FIG. 28.

Front ends of the powder hoses 58 are connected to be fixed to supply paths (not illustrated) formed by penetrating the upper surface plate 43. As shown by FIG. 31, the supply path is constituted by through holes formed at respective predetermined intervals along an inner side circle of the radius ra, the middle circle of the radius rb, the outer side circle of the radius rc. Thereby, the polishing solution W supplied from the powder hoses 58 is supplied to between the two surface plates 43, 44 by way of the respective supply paths.

Further, as shown by FIG. 7, a lower side of the lower surface plate 44 is arranged with a recovery pan 61 of receiving the polishing solution W flowing after polishing, and a polishing solution tank 62 for storing the polishing solution W received and collected by the recovery pan 61. The polishing solution tank 62 is provided with a pump 64 of agitating the polishing solution W stored at inside thereof, scooping up the polishing solution W to circulate to a circulating hose 63. Further, the circulating hose 63 is connected to a distributor 65 connected to the supply valve 57. Thereby, the recovered polishing solution W is made to be able to be returned to the supply valve 57 again and supplied to inside of the groove portion 55a of the powder ring 55.

Further, the powder ring 55, the ring plate 56, the supply valve 57, the powder hose 58, the recovery pan 61, the polishing solution tank 62, the circulating hose 63, the pump 64 and the distributor 65 are made to function as the polishing solution supplying means 45 for supplying the polishing solution W to between the upper surface plate 43 and the lower surface plate 44 by way of the supply path of the upper surface plate 43. Further, among them, the recovery pan 61, the polishing solution tank 62, the circulating hose 63, the pump 64 and the distributor 65 are made to function as polishing solution recovering means 66 for recovering the supplied polishing solution W for circulating the recovered polishing solution W to supply to between the two surface plates 43, 44 again.

Further, the recovery pan 61 is provided with a filter 67 to remove a polishing powder of the wafer S included in the recovered polishing solution W. Thereby, the clean polishing solution W is always made to be able to be continued to supply to between the two surface plates 43, 44.

Further, the polishing solution W is a solution including the polishing member (polishing grain). As the polishing member (polishing member), in the lapping, silicon carbide (SiC) is commonly used, and the polishing member having a smaller particle size of a mean particle size of about 6 μm through 9 μm is used.

Further, in the two surface plates 43, 44, different from carrying out a polishing step mentioned later, a polishing pad P is detached without being attached thereto and lapping (polishing) is carried out without using the polishing pad P.

The lapping is carried out by polishing the wafer by utilizing the wafer polishing apparatus 40 constituted in this way (S5). A wafer polishing method of the embodiment is a method of including a polishing step of polishing the both faces of the wafer S by the upper surface plate 43 and the lower surface plate 44 by using the carrier 41 shown in FIG. 5 and setting the carrier 41 above the lower surface plate 44 and rotating and revolving the carrier 41 by the planetary gear mechanism 42 thereafter. The polishing step will be explained as follows.

First, the upper surface plate 43 is moved to an upper side along the pole 54 to separate from the lower surface plate 44, thereafter, the wafer S is contained at inside of the holding hole 41b of the carrier 41. After containing the wafer S, the upper surface plate 43 is moved down along the pole 54, and the both faces of the wafer S contained at inside of the holding hole 41b are squeezed by the upper surface plate 43 and the lower surface plate 44 by applying a predetermined load. Thereby, the wafer S is brought into a state of being squeezed between surfaces of the two surface plates 43, 44.

Next, the wafer polishing processing is carried out. That is, the wafer S is adjusted to the predetermined thickness by polishing the both faces of the wafer S by the two surface plates 43, 44 while supplying the polishing solution W by the polishing solution supplying means 45. Specifically, the polishing solution W is supplied to between the upper surface plate 43 and the lower surface plate 44 by the polishing solution supplying means 45, simultaneously, the carrier 41 is revolved around the axis line L penetrating centers of the two surface plates 43, 44 while rotating the carrier 41 by driving the planetary gear mechanism 42. However, supply of the polishing solution W and operation of the planetary gear mechanism 42 may not simultaneously be carried out but the planetary gear mechanism 42 may be driven after supplying the polishing solution W. Further, the lower surface plate 44 is rotated in the direction reverse to a direction of revolving the carrier 41 simultaneously with driving the planetary gear mechanism 42.

In order to supply the polishing solution W by the polishing solution supplying means 45, the pump 64 is operated. When the pump 64 is operated, as shown by FIG. 7, the polishing solution W is agitated sufficiently at inside of the polishing solution tank 62, thereafter, scooped up and delivered to inside of the circulating hose 63. Further, after passing inside of the circulating hose 63, the polishing solution W is delivered to the distributor 65, divided by the distributor 65 and delivered to inside of the groove portion 55a at inside of the powder ring 55. The polishing solution W delivered to inside of the groove portion 55a is stored at inside of the groove portion 55a and is made to flow to the respective powder hoses 58. The polishing solution W flowing trough the powder hose 58 is made to flow to between the upper surface plate 43 and the lower surface plate 44 by way of the supply path of the upper surface plate 43. Thereby, a portion of the polishing solution W is made to flow to drop to the upper surface of the carrier 41 and a remaining portion thereof is made to flow to drop onto the lower surface plate 44. Therefore, the polishing solution W of an amount necessary for polishing is stably supplied to the wafer S and to between the two surface plates 43, 44.

When lapping is carried out in this way, since the corner portions D1 through D4 of the wafer S are constituted by the curved face shape, in polishing, even when impacted to and rubbed by the inner peripheral face of the holding hole 41b of the carrier 41, a breakage of a crack or a chip off of the corner portions D1 through D4, that is, the curved face portions of the wafer S is prevented since the holding hole 41b is provided with a circular opening, the curvature R3 of the circular shape and the opening is the same or smaller than the smallest curvature R1 (R2) in the curvatures R1, R2 of the corner portions D1 through D4 of the wafer S.

That is, when the corner portions D1 through D4 constituting the curved face portions are brought into contact with the inner peripheral face of the circular opening of the holding hole 41b of the carrier 41, not point (line) contact but substantially face contact is constituted, and therefore, the large load (impact) is not applied locally, the load is dispersed. Therefore, a breakage of a crack or a chip off brought about locally by the large load is prevented. Therefore, in the lapping step, the breakage of the corner portions D1 through D4 of the wafer S can be prevented, and therefore, yield can be promoted by improving a productivity, and a reduction in production cost can be achieved.

Further, the end face between the first curved face portions, that is, between the corner portions D1, D2 is made to constitute the reference face, and therefore, even after lapping, the reference face is made to be able to identify easily.

Further, according to the embodiment, when the wafer S is polished, the lower surface plate 44 is rotated in the direction reverse to the direction of revolving the carrier 41, and therefore, a resistance between the lower surface plate 44 and the wafer S can be increased, and the wafer S can be polished further efficiently.

Further, the polishing solution W supplied to between the two surface plates 43, 44 is recovered by the recovery pan 61 finally as shown by FIG. 7. Further, the polishing solution W and the polishing powder recovered by the recovery pan 61 is stored in the polishing solution tank 62 after passing the filter 67. In passing the filter 67, the polishing powder is removed, and therefore, only the clean polishing solution W is stored in the polishing solution tank 62. Further, the recovered polishing solution W is delivered by the pump 64 again and is used again.

In this way, the temporarily supplied polishing solution W is not abandoned to waste but can effectively be utilized again, and therefore, a reduction in cost consumed in the polishing solution W can be achieved. Further, the polishing powder can be removed by utilizing the filter 67, and therefore, only the clean polishing solution W can stably be continued to supply always and highly accurate polishing can be carried out.

When lapping is finished in this way, the wafer S is cleaned (S6). That is, the wafer S is contained in a basket, not illustrated, and dipped into a cleaning solution along with the basket. Further, an ultrasonic wave cleaning and pure water cleaning are repeatedly carried out. Further, at the same time, acid cleaning and alkali cleaning are combined to carry out. Further, after removing the polishing grain adhered to the wafer S, rinsing cleaning by pure water is carried out. Thereafter, dehydration and drying are carried out by a spin dryer.

Successively, there is carried out first etching of removing a work denatured layer brought about at a surface of the wafer S by lapping (S7). The step is a step for removing the work denatured layer by etching the both faces of the wafer S by about 10 μm by a solution of hydrogen fluoride species. In details, after containing the wafer S in the basket, the wafer S is dipped in an etching solution constituting the solution of the hydrogen fluoride species along with the basket for a predetermined time period. Further, during the time period, it is preferable to prevent a nonuniformity from being brought about in the thickness of the wafer S by slowly rocking the basket in an up and down direction. Further, after an elapse of the predetermined time period, the basket is taken out from the etching solution and dipped into pure water to sufficiently take away the etching solution.

Successively, there is carried out polishing of finishing the thickness to adjust to the predetermined thickness by subjecting the both faces of the wafer S to mirror finish polishing after drying the wafer S (S8). Although the polishing is carried out by utilizing the wafer polishing apparatus 40 shown in FIG. 7, different from previous lapping, the upper face of the lower surface plate 44 and the lower face of the upper surface plate 43 are respectively adhered with polishing pads (not illustrated) and the polishing is carried out under the state. Polishing is carried out by squeezing the both faces of the wafer S by way of the polishing pads without squeezing the wafer S directly by the two surface plates 43, 44.

Further, with regard to the carrier of holding the wafer S, similar to that in the lapping, the carrier 41 as shown by FIG. 5 constituted by including the holding hole 41b of the circular opening is used. However, the carrier 41 used in the lapping having a thin thickness in comparison with that used in lapping is used in correspondence with the wafer S constituting an object for polishing with regard to the thickness.

Further, with regard to the polishing solution W, a solution including the polishing member is used, and as the polishing member, generally, cerium oxide ($CeO_2$) is commonly used. Therefore, as the polishing solution W, a slurry containing, for example, cerium oxide, a rust preventing member and water is used.

Further, the operation of the wafer polishing apparatus 40 is carried out similar to that in lapping.

The polishing is finished as described above, and the wafer S finished highly accurately by the predetermined thickness can be provided.

Even when polishing is carried out in this way, since the corner portions D1 through D4 of the wafer S are constituted by the curved face shape similar to those in lapping, and therefore, a breakage of a crack or a chip off of the corner portions D1 through D4 of the wafer S is prevented. Therefore, even in the polishing step, the breakage of the corner portions D1 through D4 of the wafer S can be prevented, and therefore, yield can be promoted by improving a productivity and a reduction in production cost can be achieved.

Further, the end face between the first curved face portions, that is, the corner portions D1, D2 is made to constitute the reference face, and therefore, the reference face can easily be identified even after polishing.

Successively, after finishing the polishing, cleaning is carried out again (S9). That is, the wafer S is contained in a basket and cleaned by repeatedly carrying out ultrasonic wave cleaning and pure water cleaning. Further, it is preferable to store the wafer S finished with polishing in a state of being dipped in pure water or the like during a period until shifting to a next step.

Successively, there is carried out second etching of removing a damage layer produced at the surface of the wafer S by polishing or some adhered object or the like (S10). In details, etching is carried out by containing the wafer S in a basket, thereafter, dipping the wafer S in an etching solution of hydrogen fluoride species along the basket.

Next, the wafer S is cleaned by containing the wafer S in a basket, thereafter, dipping the basket to warm pure water or ultra pure water heated at a temperature of about 60° C. (S11). After cleaning, the wafer S is dehydrated by a spin drier or the like. After dehydration, the wafer S is heated in vacuum and dried by detaching adsorbed moisture. Further, after drying, it is preferable to store the wafer S in a desicator filled with nitrogen.

Next, an explanation will be given of a method of fabricating a plurality of the piezoelectric vibrators 1 at a time utilizing the wafer S polished as described above, in reference to a flowchart shown in FIG. 10 and FIG. 11.

The method of fabricating the piezoelectric vibrator 1 of the embodiment is a method of fabricating the piezoelectric vibrator 1 for successively carrying out an outer shape forming step, an electrode forming step, a cutting step, a mount step and a sealing step. The respective steps will be explained in details as follows.

First, there is carried out an outer shape forming step of patterning outer shapes of a plurality of the piezoelectric vibrating pieces 2 by etching the wafer S as polished by a photolithography technology (S20). The step will specifically be explained.

Figure 12:
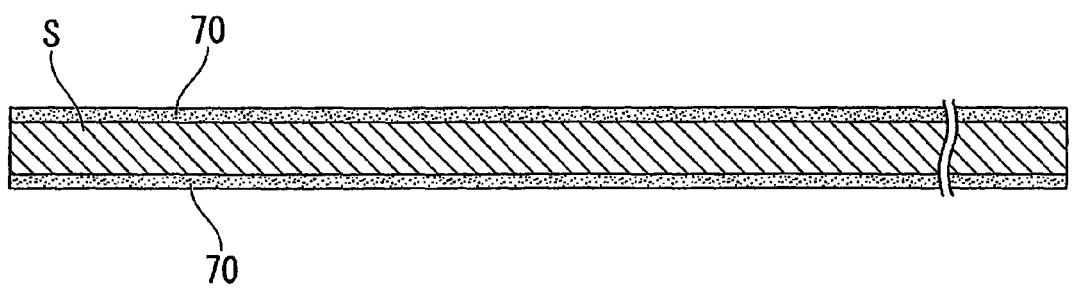
FIG. 12 is a view showing one step in fabricating the piezoelectric vibrator according to the flowchart shown in FIG. 10 and is a view showing a state of forming etching films on both faces of the wafer.

First, the wafer S finished with polishing is prepared (S21), as shown by FIG. 12, the etching protecting films 70 are respectively formed on the both faces of the wafer S as shown by FIG. 12 (S22). As the etching protecting film 70, for example, chromium (Cr) is formed by several μm. Successively, a photoresist film, not illustrated, is patterned on the etching protecting film 70 by a photolithography technology. At this occasion, patterning is carried out to surround the surrounding of the piezoelectric vibrating piece 2. Further, etching is carried out by constituting a mask by the photoresist film and the etching protecting film 70 which is not masked is selectively removed.

Further, according to the wafer S, the reference face with regard to crystal orientation is made to be identified easily, and therefore, positioning of the mask or the like becomes easy in carrying out patterning.

Figure 13:
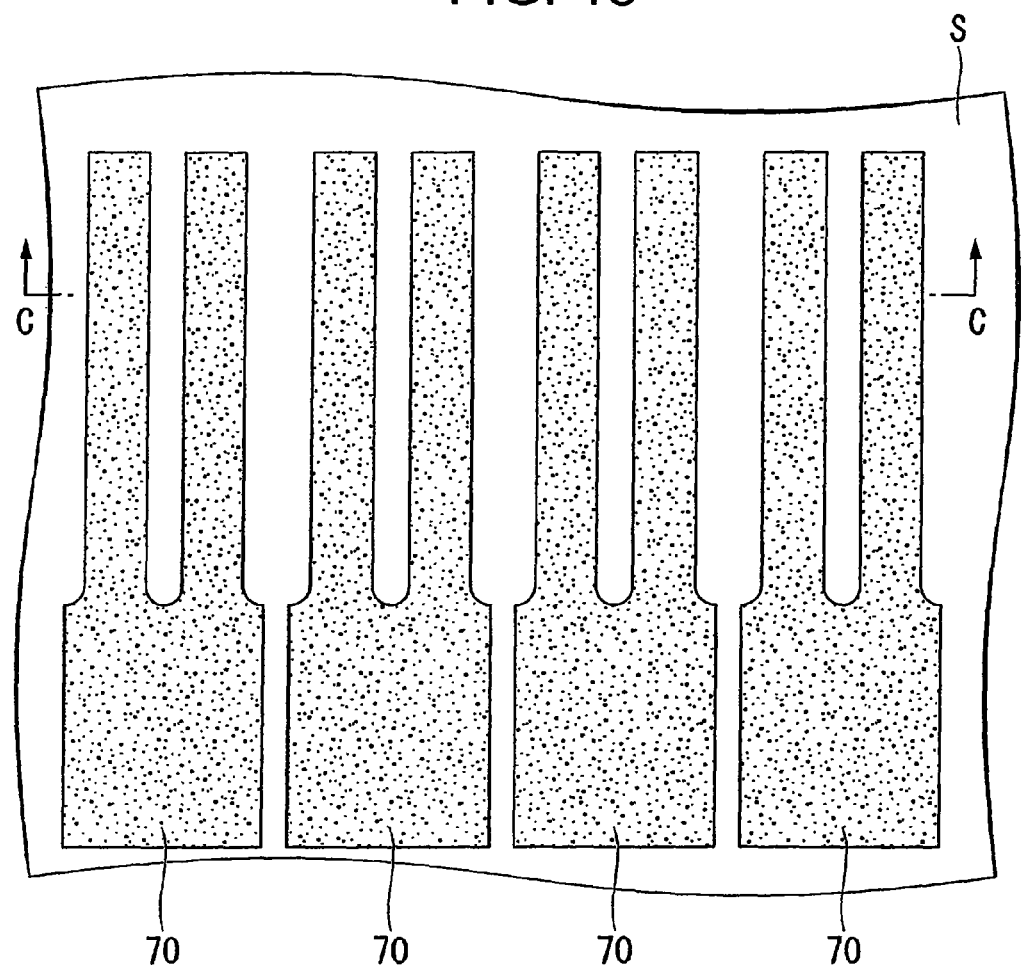
FIG. 13 is a view showing a state after patterning an etching protecting film from the state shown in FIG. 12 and is a view viewing a wafer from an upper side.
Figure 14:
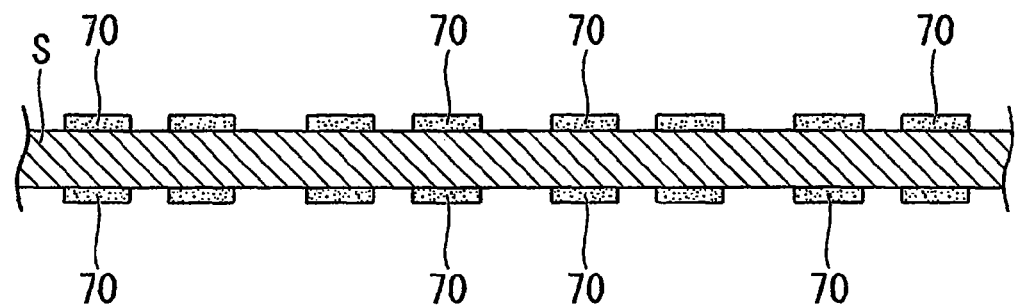
FIG. 14 is a sectional view taken along a line C-C of FIG. 13.

Further, the photoresist film is removed after etching. Thereby, as shown by FIG. 13 and FIG. 14, the etching protecting film 70 can be patterned to the above-described shape (S23). That is, the patterning can be carried out along an outer shape of the piezoelectric vibrating piece 2, that is, outer shapes of the pair of vibrating arm portions 10, 11 and the base portion 12. Further, at this occasion, patterning is carried out by a number of a plurality of piezoelectric vibrating pieces 2. Further, FIG. 14 through FIG. 19 are views showing sections taken along a cut line C-C shown in FIG. 13.

Figure 15:
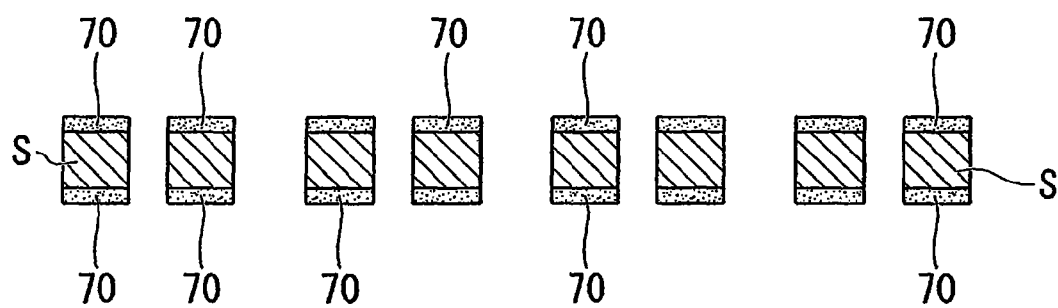
FIG. 15 is a view showing a state of working a wafer by etching by constituting a mask by an etching protecting film from a state shown in FIG. 14.

Next, the both faces of the wafer S are respectively etched by constituting a mask by the patterned etching protecting film 70 (S24). Thereby, as shown by FIG. 15, the outer shape of the piezoelectric vibrating piece 2 can be formed by selectively removing a region of the etching protecting film 70 which is not masked. At the time point, the outer shape forming step is finished. Further, the piezoelectric vibrating piece 2 is brought into a state of being connected to the wafer S by way of a connecting portion, not illustrated, until carrying out a cutting step carried out later.

Next, according to the embodiment, a groove portion forming step of forming the groove portion 18 at the pair of vibrating arm portions 10, 11 before carrying out an electrode forming step (S30). The step will be specifically explained.

Figure 16:
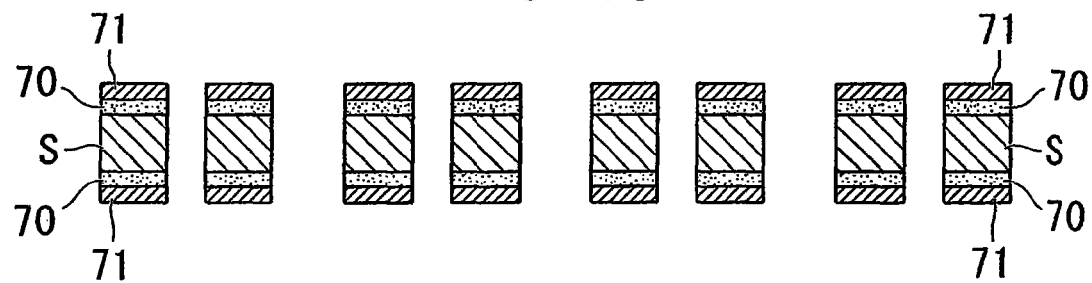
FIG. 16 is a view showing a state of forming photoresist films on both faces of a wafer from the state shown in FIG. 15.
Figure 17:
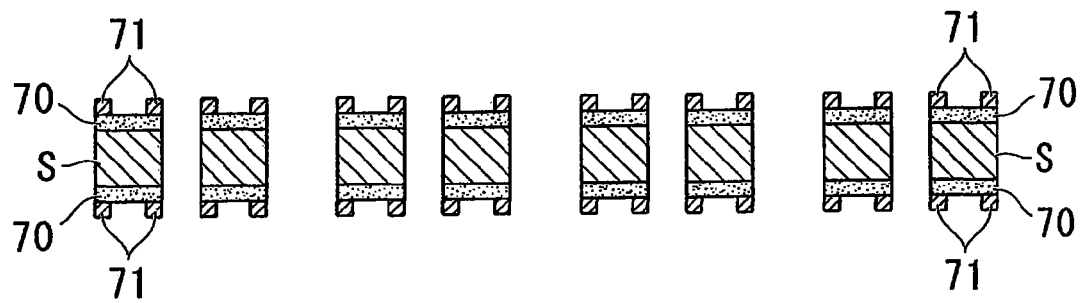
FIG. 17 is a view showing a state after patterning a photoresist film from the state shown in FIG. 16.
Figure 18:
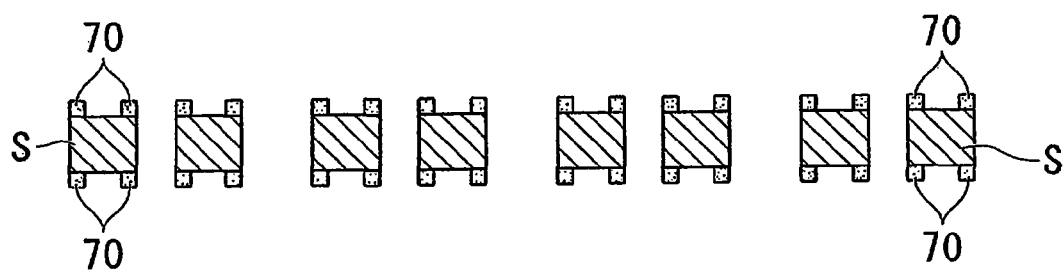
FIG. 18 is a view showing a state after working the etching protecting film by etching and carrying out patterning by constituting a mask by the patterned photoresist film from the state shown in FIG. 17.

First, as shown by FIG. 16, a photoresist film 71 is formed on the etching protecting film 70 by spray coating or the like (S31). Further, the photoresist film 71 is patterned by a photolithography technology. At this occasion, as shown by FIG. 17, patterning is carried out along the outer shape of the piezoelectric vibrating piece 2 in a state of opening the region of the groove portion 18 (S32). Further, the etching protecting film 70 which is not masked is selectively removed by carrying out etching by constituting a mask by the patterned photoresist film 71 (S33). Further, the photoresist film 71 is removed after etching. Thereby, as shown by FIG. 18, the etching protecting film 70 which is patterned already can be patterned further in the state of opening the region of the groove portion 18.

Figure 19:
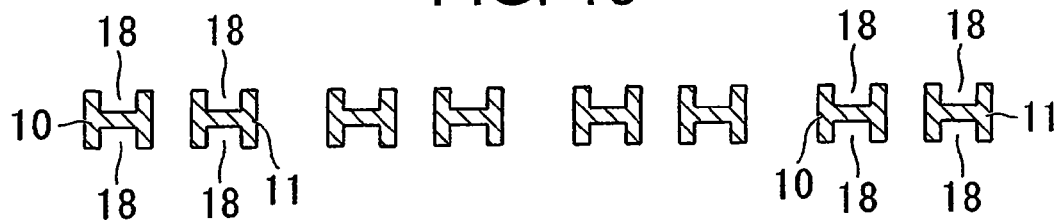
FIG. 19 is a view showing a state of working a wafer by etching by constituting a mask by the patterned etching protecting film from the state shown in FIG. 18.

Successively, after etching the wafer S by constituting a mask by the patterned etching protecting film 70 again (S34), the etching protecting film 70 constituting the mask is removed (S35). Thereby, as shown by FIG. 19, the groove portion 18 can be formed by the pair of vibrating arm portions 10, 11. At the time point, the groove portion forming step is finished.

Next, there is carried out an electrode forming step of respectively forming the exciting electrode 15, the leadout electrodes 19, 20, and the mount electrodes 16, 17 by forming electrode films, not illustrated, on the outer surfaces of the plurality of piezoelectric vibrating pieces 2 and carrying out patterning (S40). Further, simultaneously therewith, the weight metal film 21 is formed by a similar method (S41).

Successively, there is carried out a cutting step of cutting the connecting portion of connecting the wafer S and the piezoelectric vibrating piece 2 to cut to separate the plurality of piezoelectric vibrating pieces 2 from the wafer S to fragment (S42). Thereby, a plurality of the piezoelectric vibrating pieces 2 formed with respective electrodes of the exciting electrodes 15, the leadout electrodes 19, 20 and the mount electrodes, 16, 17 can be fabricated at a time from the wafer S adjusted to a predetermined thickness.

Successively, before mounting the piezoelectric vibrating piece 2, rough adjustment of a resonance frequency is carried out (S43). This is carried out by changing a weight by irradiating laser light to the rough adjusting film 21a of the weight metal film 21 to partially evaporate. Further, the fine adjustment of adjusting the resonance frequency further highly accurately is carried out later. An explanation thereof will be given later.

Next, there is carried out an airtight terminal fabricating step of fabricating the plug 4 (S50). Specifically, first, the stem 30 is fabricated by a stem fabricating step (S51). That is, a bottomed cylinder member is formed by working a plate member having a conductivity of iron nickel cobalt alloy, iron nickel alloy or the like into a lance, thereafter, carrying out deep drawing by a plurality of times. Further, the stem 30 is fabricated by forming an opening at a bottom face of a cylinder member and cutting to separate the cylinder member from the plate member by carrying out outer shape drawing.

Next, there is carried out a setting step of respectively setting the lead terminal 31 and the filling member 32 at inside of the stem 30 (S52). First, the fabricating stem 30 is set to an exclusive jig, not illustrated, thereafter, the filling member 32 previously sintered in the ring-like shape is set to inside of the stem 30, and the lead terminal 31 is set to penetrate the filling member 32.

After combining the stem 30 and the lead terminal 31 and the filling member 32 by the setting step, the jig is put into a heating furnace and the filling member 32 is sintered in a temperature atmosphere of around 1000° C. (S53). Thereby, an interval between the filling member 32 and the lead terminal 31 and an interval between the filling member 32 and the stem 30 are completely sealed to constitute a structure withstanding air tightness. Further, the plug 4 can be provided by being taken out from the jig. At the time point, the airtight terminal fabricating step is finished.

Next, there is carried out a plating step of coating metal films of the same material on the outer surface of the lead terminal 31 and the outer periphery of the stem 30 (S60). As a pretreatment therefor, the outer surface of the lead terminal 31 and the outer periphery of the stem 30 are cleaned, degreased by an alkaline solution, thereafter, cleaned by acid by a solution of hydrochrolic acid and sulfuric acid. After finishing the pretreatment, a matrix metal film is formed on the outer surface of the lead terminal 31 and the outer peripheral face of the stem 30. For example, Cu plating or Ni plating is coated by a film thickness of substantially 2 μm through 5 μm. Successively, a finish metal film is formed on the matrix metal film. For example, other than a single material of tin, silver or the like, heat resistant plating, tin copper alloy, tin bismuth film alloy, tin antimony alloy or the like is coated by a film thickness of substantially 8 μm through 15 μm.

By coating the metal film including the matrix metal film and the finish metal film in this way, the inner lead 31a and the piezoelectric vibrating piece 2 can be connected. Further, not only connection of the piezoelectric vibrating piece 2 but the metal film coated on the outer periphery of the stem 30 is provide with a property of being soft and elastically deformed, and therefore, cold pressure welding of the stem 30 and the case 3 can be carried out and airtight bonding can be carried out.

Successively, in order to stabilize the metal film, annealing is carried out in a furnace in a vacuum atmosphere (S61). For example, heating is carried out for one hour by a temperature of 170° C. Thereby, whisker can be restrained from being brought about by adjusting a composition of an intermetalic compound formed at an interface of a material of the matrix metal film and a material of the finish metal film. A mount step can be carried out at a time point of finishing the annealing. Further, although an example is taken by a case of coating the metal film by the wet plating method when the metal film is coated, the invention is not limited thereto but, for example, the coating may be carried out by a vapor deposition method, a chemical gas phase method or the like.

Further, according to the embodiment, after finishing the annealing, a conductive bump E of gold or the like is formed at the front end of the inner lead 31a for a mount step carried out successively (S62). Further, there is carried out the mount step of bonding the mount electrodes 16,17 of the piezoelectric vibrating piece 2 to the inner leads 31a (S63). Specifically, the inner lead 31a and the piezoelectric vibrating piece 2 are overlapped by a predetermined pressure in a state of interposing the bump E therebetween while heating the bump E. Thereby, the inner leads 31a and the mount electrodes 16, 17 can be connected by way of the bumps E. As a result, the piezoelectric vibrating piece 2 can be mounted. That is, the piezoelectric vibrating piece 2 is brought into a state of being mechanically supported by and electrically connected to the lead terminal 31.

Further, although in carrying out bump connection, mounting is carried out by carrying out heating and pressurizing, the bump connection may be carried out by utilizing an ultrasonic wave.

Next, before carrying out a sealing step, in order to eliminate a strain by mounting, baking is carried out at a predetermined temperature (S64). Successively, a frequency adjustment (fine adjustment) of the piezoelectric vibrating piece 2 is carried out (S65). Specifically explaining the frequency adjustment, the piezoelectric vibrating piece 2 is vibrated by applying a voltage between the outer leads 31b in a state of putting a total into a vacuum chamber. Further, the frequency is adjusted by evaporating the fine adjusting film 21b of the weight metal film 21 by laser while measuring the frequency. Further, in order to measure the frequency, the measurement can accurately be carried out by pressing a front end of a probe, not illustrated, to the outer lead 31b. By carrying out the frequency adjustment, the frequency of the piezoelectric vibrating piece 2 can be adjusted within a previously determined range of the frequency.

Further, although in the fine adjustment and the rough adjustment carried out previously, the frequency adjustment is carried out by evaporating the weight metal film 21 by irradiating laser, not laser but argon ion may be utilized. In this case, sputtering is carried out by irradiating argon ion, and the frequency adjustment is carried out by removing the weight metal film 21.

Finally, there is carried out a sealing step of sealing the piezoelectric vibrating piece 2 in airtight by press-fitting the case 3 to the stem 30 to contain the mounted piezoelectric vibrating piece 2 to inside thereof (S66). Specifically explaining, the case 3 is press-fit to the outer periphery of the stem 30 of the plug 4 while applying a predetermined load in vacuum. Then, the metal film formed on the outer periphery of the stem 30 is elastically deformed, and therefore, airtight sealing can be carried out by cold pressure welding. Thereby, the piezoelectric vibrating piece 2 can be hermetically closed at inside of the case 3 to be sealed in vacuum.

Further, before carrying out the step, it is preferable to detach moisture or the like adsorbed to the surface by sufficiently heating the case 3 and the plug 4.

Further, after finishing to fix the case 3, screening is carried out (S67). The screening is carried out for stabilizing a frequency or a resonance resistance value and preventing metal whisker caused by a compressive stress from being brought about at a fitting portion press-fit with the case 3.

After finishing the screening, an electric property inspection of an inner portion is carried out (S68). That is, a resonance frequency, a resonance resistance value, a drive level property (exciting power dependency of resonance frequency and resonance resistance value) or the like of the piezoelectric vibrating piece 2 are measured and checked. Further, an insulating resistance property or the like is checked along therewith. Further, finally, a dimension, a quality or the like is finally checked by carrying out an outlook inspection of the piezoelectric vibrating piece 1. As a result, the piezoelectric vibrating piece 1 shown in FIG. 1 can be fabricated.

Particularly, according to the fabricating method of the embodiment, the wafer S excellently polished in a state of preventing a breakage by the wafer polishing method is utilized, and therefore, when a total of the fabricating steps is viewed, yield can be promoted by improving a productivity. Therefore, a reduction in fabrication cost can be achieved.

Further, although according to the embodiment, the wafer S of the invention substantially in the rectangular shape is constituted as shown by FIG. 5, the wafer S may be constituted substantially by a triangular shape, substantially a pentagonal shape, substantially a hexagonal shape or the like so far as the wafer S is constituted by substantially by an angular shape constituted by subjecting a corner portion to R chamfering.

Further, although the carrier according to the invention formed with only one of the holding hole 41b is exemplified as shown by FIG. 5, a plurality of the holding holes 41b may be formed in order to hold a plurality of the wafers S simultaneously.

Although according to the embodiment, as the piezoelectric vibrator according to the invention, an explanation is given by an example of the piezoelectric vibrator 1 including the piezoelectric vibrating piece 2 of a tuning fork type, the invention is not limited to the piezoelectric vibrator 1.

Figure 20:
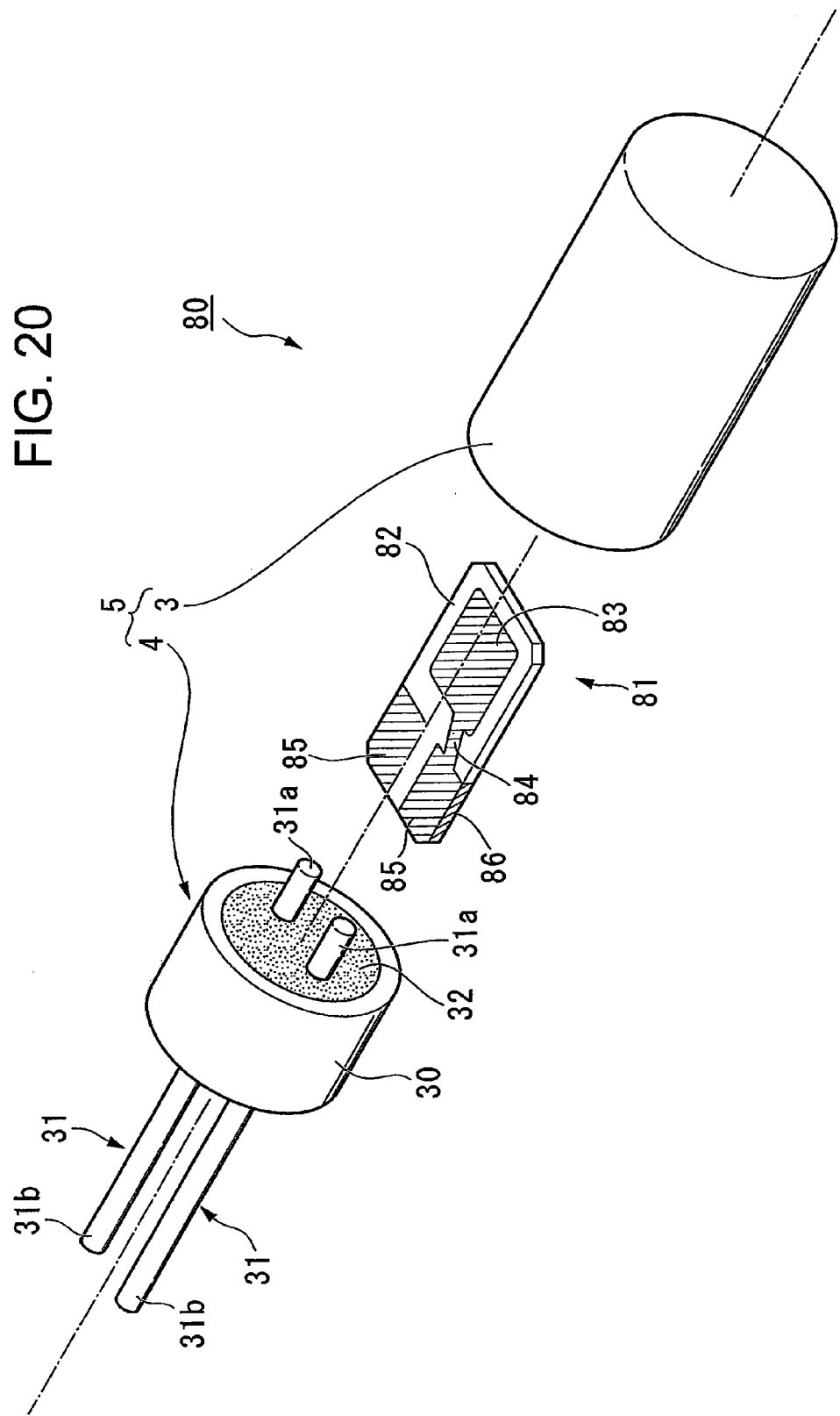
FIG. 20 is a view showing other example of a piezoelectric vibrator according to the invention and is a perspective view of a piezoelectric vibrator of carrying out a thickness slipping vibration.

For example, as shown by FIG. 20, a thickness slipping vibrator (piezoelectric vibrator) 80 having a thickness slipping vibrating piece (piezoelectric vibrating piece) 81 will do. The thickness slipping vibrating piece 81 includes a piezoelectric vibrating plate 82 formed from the wafer S in a plate-like shape by a constant thickness, an exciting electrode 83, a leadout electrode 84, and a mount electrode 85. The piezoelectric vibrating plate 82 is formed, for example, in a rectangular shape in an outer shape thereof, and formed such that the exciting electrodes 83 are opposed to each other substantially at center portions of both faces. An end portion of the piezoelectric plate 82 is formed with the mount electrode 85 electrically connected to the exciting electrode 83 by way of the leadout electrode 84. Further, the mount electrode 85 connected to the exciting electrode 83 on one side and the mount electrode 85 connected to the exciting electrode 83 on other side are respectively formed at both faces of the piezoelectric plate 82. At this occasion, the mount electrode 85 formed at one face of the piezoelectric plate 82 is electrically connected to the mount electrode 85 formed at other face thereof by way of a side face electrode 86 formed on a side face of the piezoelectric plate 82.

Even according to the thickness slipping vibrator 80 constituted in this way, the thickness vibrating piece 81 is fabricated from the wafer S polished by the wafer polishing apparatus 40 and the wafer polishing method, and therefore, the production cost is reduced in comparison with the background art.

Figure 21:
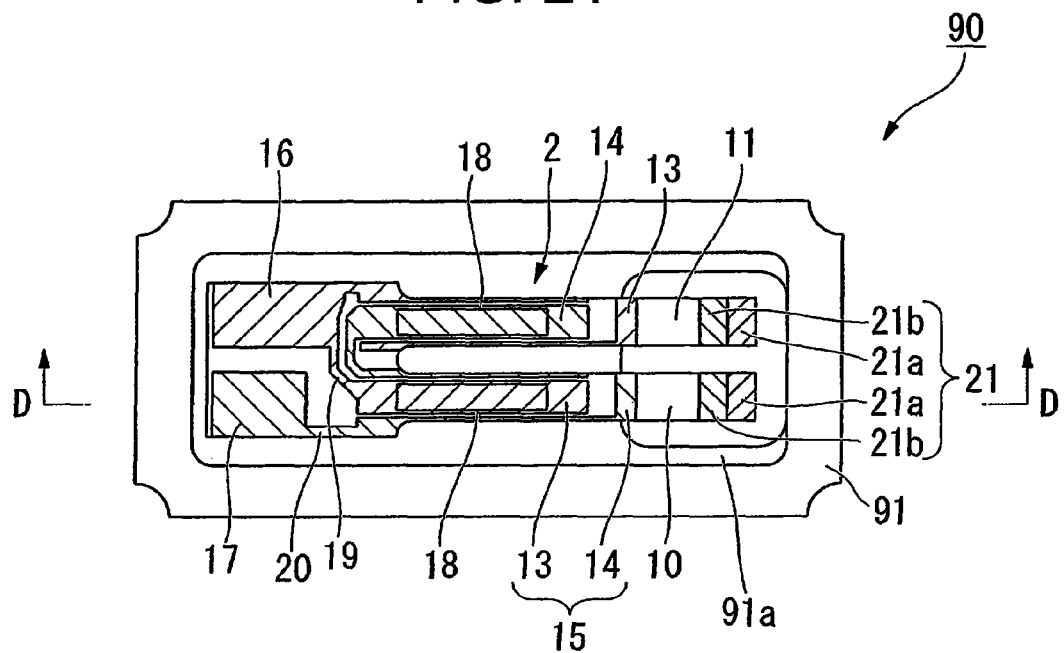
FIG. 21 is a view showing other example of a piezoelectric vibrator according to the invention and is a top view of a piezoelectric vibrator of a ceramic package type.
Figure 22:
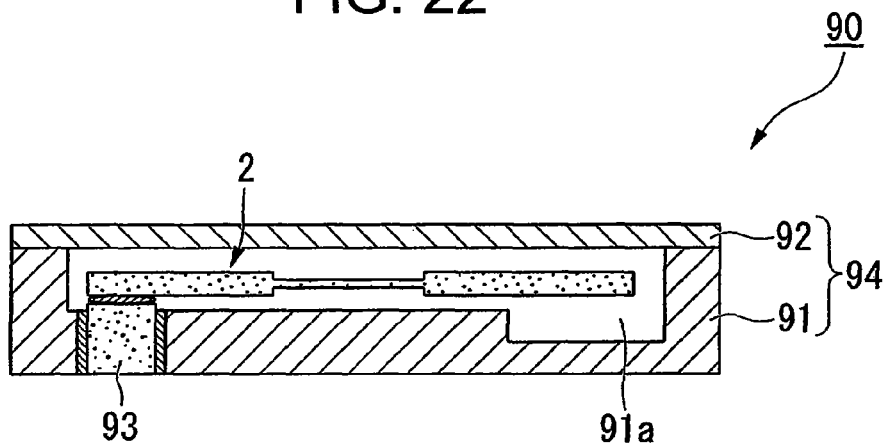
FIG. 22 is a sectional view taken along a line D-D of FIG. 21.

Further, although in the embodiment, as an example of the piezoelectric vibrator, an explanation has been given by taking an example of the piezoelectric vibrator 1 of the cylinder package type, the invention is not limited to the piezoelectric vibrator 1. For example, as shown by FIG. 21 and FIG. 22, a piezoelectric vibrator 90 of a ceramic package type will do.

The piezoelectric vibrator 90 includes a base 91 formed with a recess portion 91a at inside thereof, the piezoelectric vibrating piece 2 contained at inside of the recess portion 91a of the base 91, and a lid 92 fixed to the base 91 in a state of containing the piezoelectric vibrating piece 2.

The base 91 is arranged with a lead 93 having a hermetic sealing structure, and a front end thereof is provided with the bump (not illustrated). Further, the bumps and the mount electrodes 16, 17 of the piezoelectric vibrating piece 2 are mechanically and electrically connected. Further, the lead 93 is exposed at a bottom face of the base 91. That is, the lead 93 is made to function as an external connecting terminal one end side of which is electrically connected to outside and other end side of which is electrically connected to the mount electrodes 16, 17.

Further, the base 91 is sealed in airtight in vacuum by using various means of electron beam welding in vacuum, seam welding in vacuum, or bonding by a low melting point glass or a eutectic metal or the like. Thereby, the piezoelectric vibrating piece 2 is sealed in airtight at inside thereof. That is, the base 91 and the lid 92 are made to function as a sealing member 94 for sealing the piezoelectric vibrating piece 2 in airtight.

Even according to the piezoelectric vibrator 90 constituted in this way, the piezoelectric vibrating piece 2 is fabricated from the wafer S polished by the wafer polishing apparatus 40 and the wafer polishing method, and therefore, the production cost is reduced in comparison with the background art.

Further, a surface mounting type vibrator 100 may be constituted by fixing the piezoelectric vibrator 1 of the cylinder package type by a mold resin portion 101.

Figure 23:
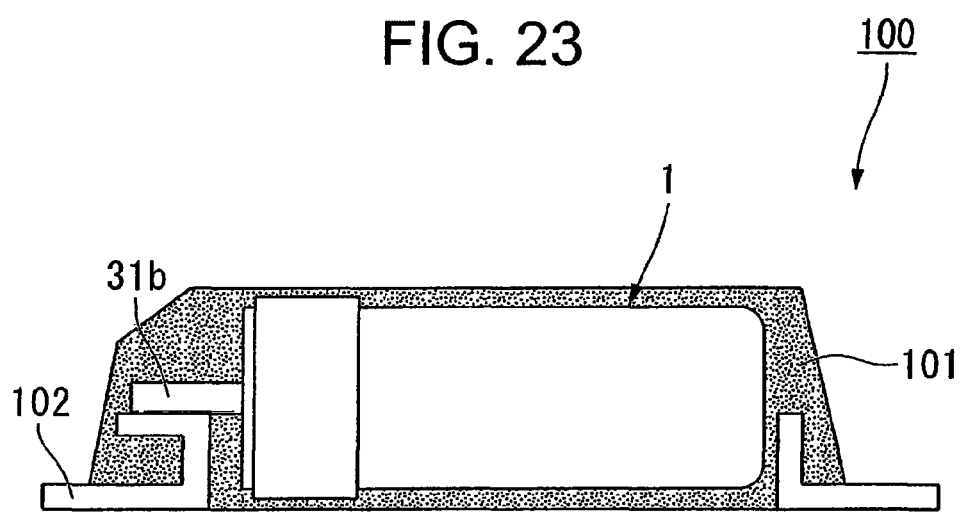
FIG. 23 is a sectional view showing a surface mounting type vibrator having a piezoelectric vibrator according to the invention.
Figure 24:
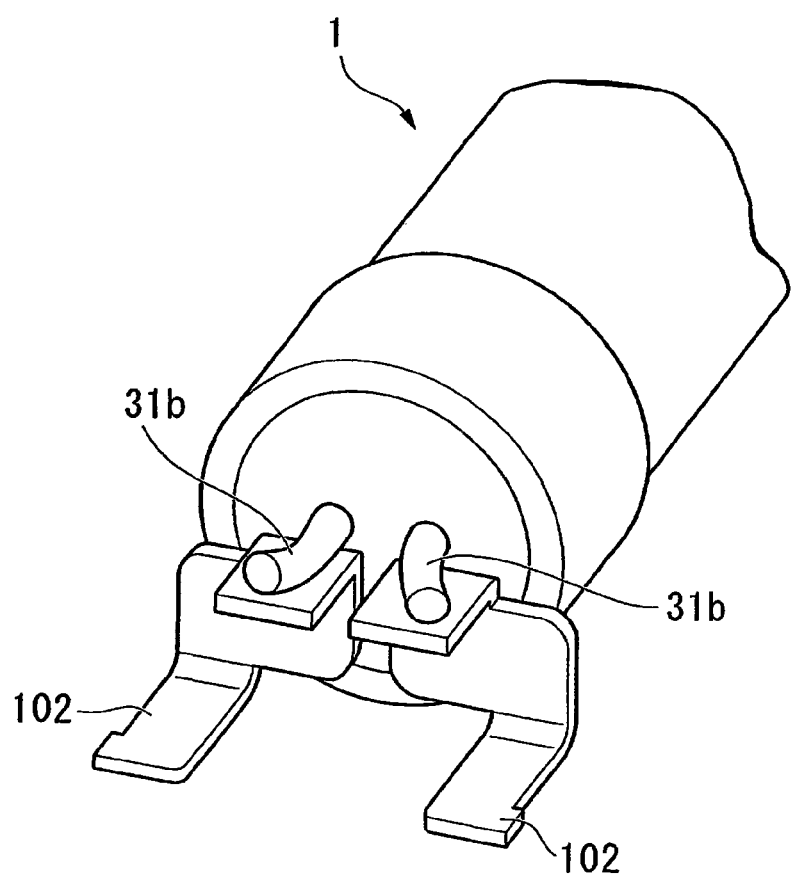
FIG. 24 is a perspective view showing a relationship of attaching the piezoelectric vibrator shown in FIG. 23 and an external portion connecting terminal.

As shown by FIG. 23 and FIG. 24, the surface mounting type vibrator 100 includes the piezoelectric vibrator 1, the mold resin portion 101 of fixing the piezoelectric vibrator 1 by a predetermined shape, and an external portion connecting terminal 102 one end side of which is connected electrically to the outer lead 31b and other end side of which is electrically connected to outside by being exposed at a bottom face of the mold resin portion 101. The external connecting terminal 102 is formed in a channel-like shape in a section thereof by a metal material of copper or the like. By fixing the piezoelectric vibrator 1 by the mold resin portion 101 in this way, the piezoelectric vibrator 1 can stably be attached to a circuit board or the like, and therefore, the piezoelectric vibrator 1 is easier to use and an easiness of use is promoted. Particularly, the piezoelectric vibrator 1 is reduced in production cost as compared with the existing ones and therefore the surface mounting type vibrator 100 is also reduced in production cost.

Next, an embodiment of an oscillator according to the invention will be explained in reference to FIG. 25.

Figure 25:
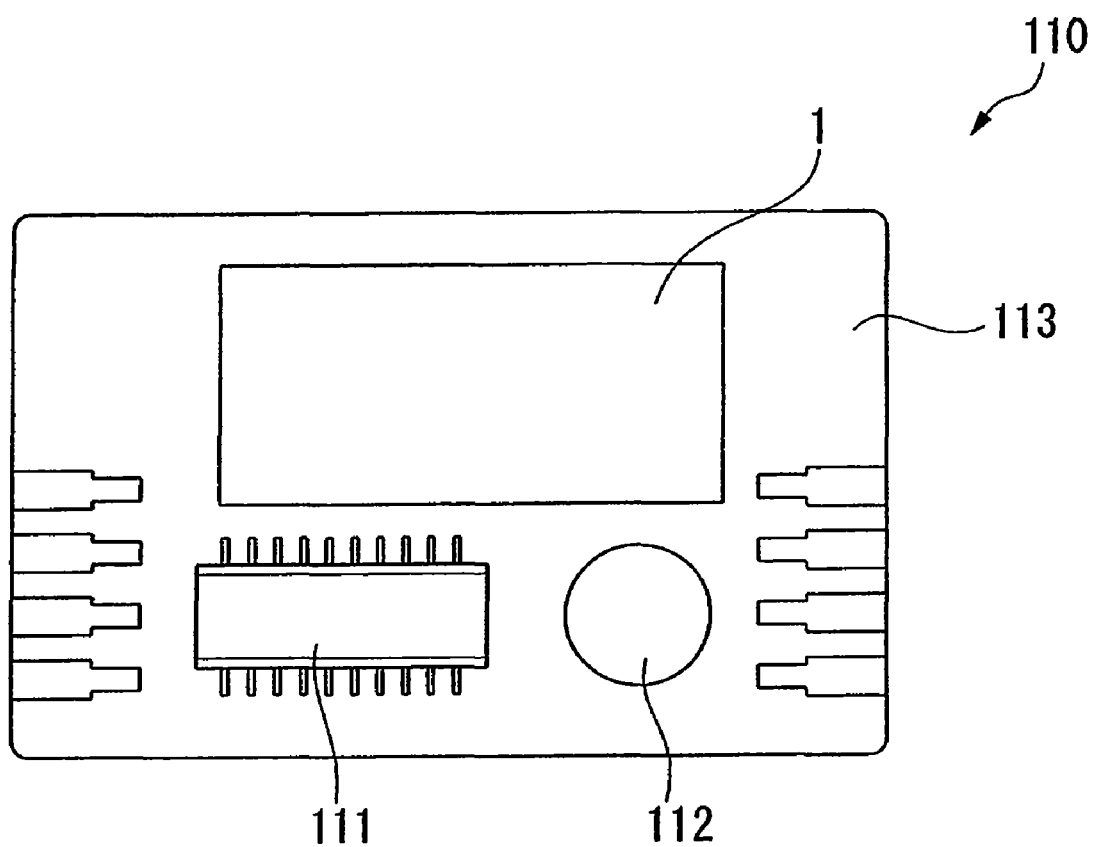
FIG. 25 is a constitution view showing an embodiment of an oscillator according to the invention.

As shown by FIG. 25, an oscillator 110 of the embodiment constitutes the piezoelectric vibrator 1 as an oscillating piece electrically connected to an integrated circuit 111. The oscillator 110 includes a board 113 mounted with an electronic part 112 of a capacitor or the like. The board 113 is mounted with the integrated circuit 111 for the oscillator and a vicinity of the integrated circuit 111 is mounted with the piezoelectric vibrating piece of the piezoelectric vibrator 1. The electronic part 112, the integrated circuit 111 and the piezoelectric vibrator 1 are respectively electrically connected by a wiring pattern, not illustrated. Further, respective various constituent parts are molded by a resin, not illustrated.

In the oscillator 110 constituted in this way, when a voltage is applied to the piezoelectric vibrator 1, the piezoelectric vibrating piece 2 at inside of the piezoelectric vibrator 1 is vibrated. The vibration is converted into an electric signal by a piezoelectric property provided to the piezoelectric vibrating piece 2 and is inputted to the integrated circuit 111 as the electric signal. The inputted electric signal is variously processed by the integrated circuit 111 and is outputted as a frequency signal. Thereby, the piezoelectric vibrator 1 is made to function as an oscillating piece.

Further, a constitution of the integrated circuit 111 can be added with a function of controlling date or time of operating the apparatus or an external apparatus, providing time, calendar or the like other than a single function oscillator of a timepiece or the like by selecting, for example, RTC (real time clock) module or the like in accordance with a request.

According to the oscillator 110 of the embodiment, the piezoelectric vibrator 1 reducing production cost in comparison with the background art is provided, and therefore, production cost is reduced also for the oscillator 110 per se.

Figure 26:
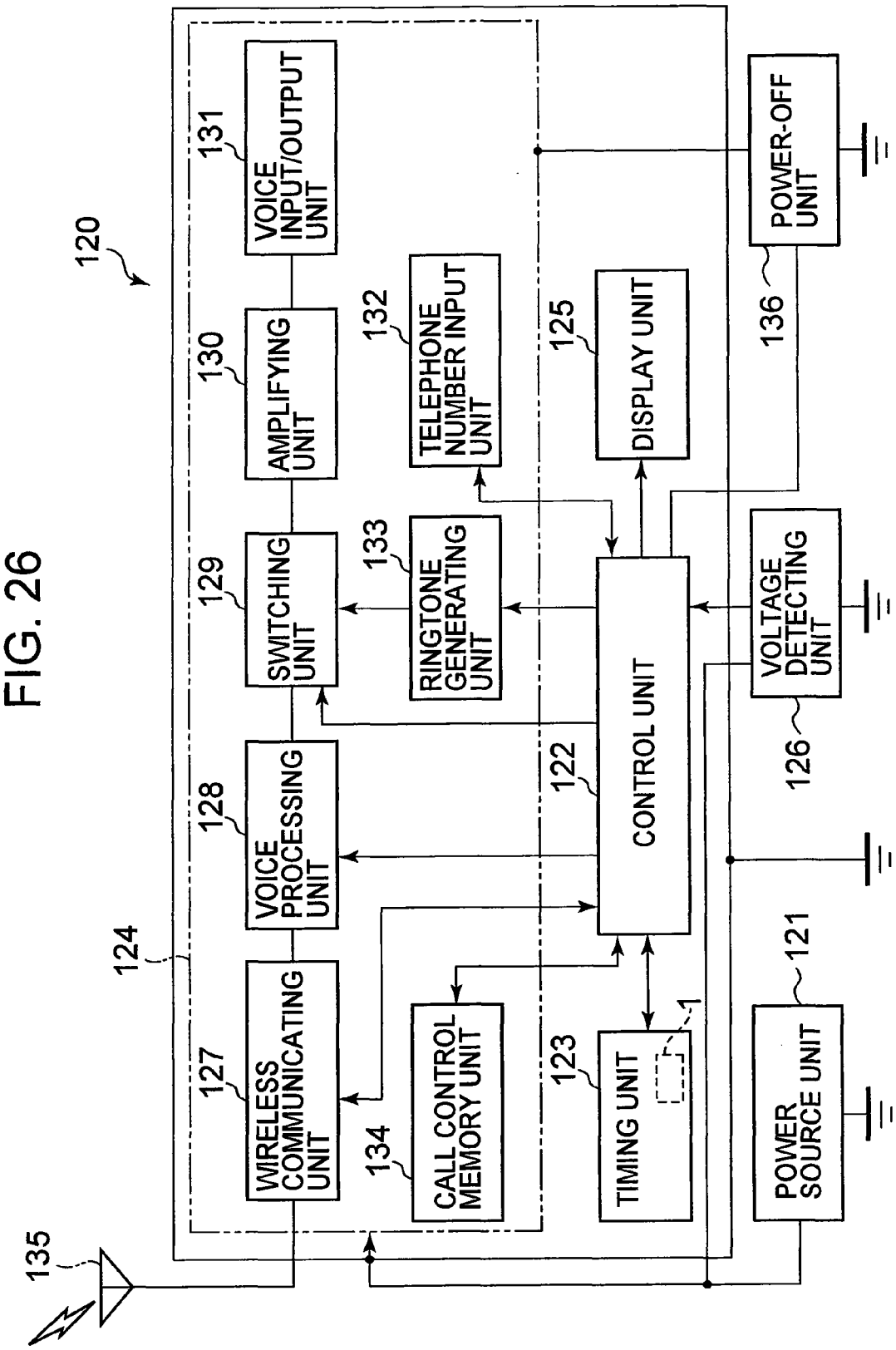
FIG. 26 is a constitution view showing an embodiment of an electronic apparatus according to the invention.

Next, an explanation will be given of an embodiment of an electronic apparatus according to the invention in reference to FIG. 26. Further, as an electronic apparatus, an explanation will be given by taking an example of a portable information apparatus 120 having the piezoelectric vibrator 1. First, the portable information apparatus 120 of the embodiment is represented by, for example, a portable telephone and develops and improves a wristwatch according to the background art. An outlook thereof is similar to a wristwatch, a liquid crystal display is arranged at a portion thereof in correspondence with a dial and current time or the like is displayed on the screen. Further, when utilized as the communicating machine, the electronic apparatus is detached from the wrist, and can carry out a communication similar to that of the portable telephone of the background art by a speaker and a microphone included on an inner side of a strap. However, the electronic apparatus is remarkably small-sized and lightweighted in comparison with the portable telephone of the background art.

Next, a constitution of a portable information apparatus 120 of the embodiment will be explained. As shown by FIG. 26, the portable information apparatus 120 includes the piezoelectric vibrator 1 and a power source portion 121 for supplying a power. The power source portion 121 is constituted by a lithium secondary cell. The power source portion 121 is connected in parallel with a control portion 122 of carrying out various controls, a time counting portion 123 of counting time or the like, a communicating portion 124 for carrying out a communication with outside, a display portion 125 for displaying various information, and a voltage detecting portion 126 of detecting voltages of various function portions. Further, the power is supplied to the respective function portions by the power source portion 121.

The control portion 122 carries out a control of operating a total of a system of transmitting and receiving voice data, measuring or displaying current time or the like by controlling the respective function portions. Further, the control portion 122 includes ROM previously written with programs, CPU of reading and executing the programs written to ROM, and RAM or the like used as a work area of CPU.

The time counting portion 123 includes an integrated circuit including an oscillating circuit, a register circuit, a counter circuit and an interface circuit or the like, and the piezoelectric vibrator 1. When a voltage is applied to the piezoelectric vibrator 1, the piezoelectric vibrating piece 2 is vibrated, the vibration is converted into an electric signal by a piezoelectric electric property provided to quartz, and is inputted to the oscillating circuit as the electric signal. An output of the oscillating circuit is binalized and counted by the register circuit and the counter circuit. Further, a signal is transmitted and received to and from the control circuit 122 by way of the interface circuit, and current time or current date or calendar information or the like is displayed on the display portion 125.

The communicating portion 124 is provided with a function similar to that of the portable telephone of the background art, and includes a wireless portion 127, a voice processing portion 118, a switching portion 129, an amplifying portion 130, a voice inputting and outputting portion 131, a telephone number inputting portion 132, and arrival sound generating portion 133, and a call control memory portion 134.

The wireless portion 127 exchanges to transmit and receive various data of voice data or the like to and from a base station by way of an antenna 135. The voice processing portion 128 codes and decodes a voice signal inputted from the wireless portion 127 or the amplifying portion 130. The amplifying portion 130 amplifies a signal inputted from the voice processing portion 128 or the voice inputting and outputting portion 131 to a predetermined level. The voice inputting and outputting portion 131 is constituted by a speaker, a microphone or the like for amplifying sound or speech voice or collects voice.

Further, the arrival sound generating portion 133 generates arrival sound in accordance with a call from the base station. The switching portion 129 switches the amplifying portion 130 connected to the voice processing portion 128 to the arrival sound generating portion 133 only at arrival of signal, thereby, the arrival sound generated by the arrival sound generating portion 133 is outputted to the voice inputting and outputting portion 131 by way of the amplifying portion 130.

Further, the call control memory portion 134 contains a program related to an emitting and arriving call control of the communication. Further, the telephone number inputting portion 132 includes number keys of 0 through 9 and other key and a telephone number of speech destination or the like is inputted by depressing the number keys and the like.

When a voltage applied to the respective function portions of the control portion 122 and the like by the power source portion 121 becomes lower than a predetermined value, the voltage detecting portion 126 detects the voltage drop to inform to the control portion 122. A predetermined voltage value at this occasion is a value previously set as a minimum voltage necessary to stably operating the communicating portion 124, and becomes, for example, about 3 V. The control portion 122 informed of the voltage drop from the voltage detecting portion 126 prohibits operations of the wireless portion 127, the voice processing portion 128, the switching portion 129 and the arrival sound generating portion 133. Particularly, it is indispensable to stop operating the wireless portion 127 having a large power consumption. Further, the display portion 125 is displayed with a statement that the communicating portion 124 cannot be used by a deficiency in a remaining amount of the battery.

That is, the operation of the communicating portion 124 can be prohibited and the statement can be displayed on the display portion 125 by the voltage detecting portion 126 and the control portion 122. Although the display may be constituted by a character message, as a further intuitive display, a x (check) mark may be attached to a telephone icon displayed at an upper portion of a display face of the display portion 125.

Further, by providing a power source cutting portion 136 capable of selectively cutting a power source of a portion related to the function of the communicating portion 124, the function of the communicating portion 124 can further be stopped.

As described above, according to the portable information apparatus 120 of the embodiment, the piezoelectric vibrator 1 reducing the production cost in comparison with the background art is provided, and therefore, the production cost is reduced also with regard to the portable information apparatus 120 per se.

Next, an embodiment of a radiowave timepiece according to the invention will be explained in reference to FIG. 27.

Figure 27:
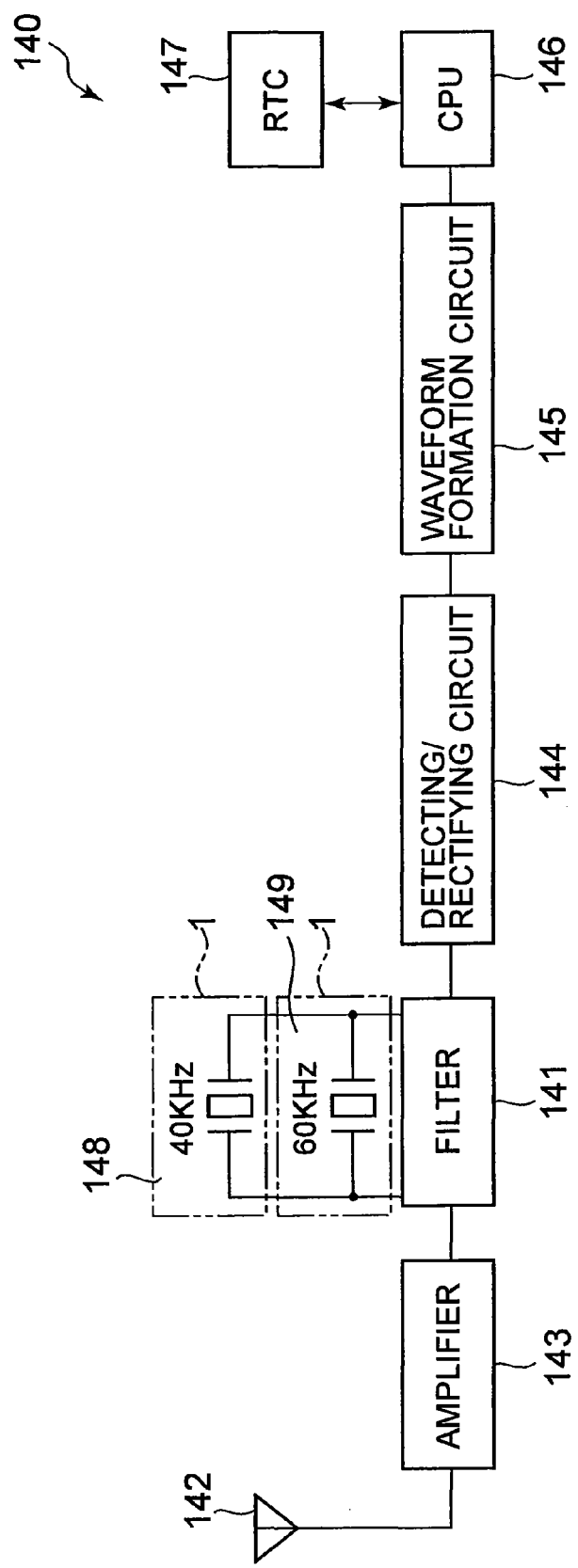
FIG. 27 is a constitution view showing an embodiment of a radiowave timepiece according to the invention.

As shown by FIG. 27, a radiowave timepiece 140 of the embodiment includes the piezoelectric vibrator 1 electrically connected to a filter portion 141, and is a timepiece provided with a function of automatically correcting time to accurate time to display by receiving a standard radiowave including time information.

In Japan, there are transmitting places (transmitting stations) for transmitting a standard radiowave at Fukushima prefecture (40 kHz) and Saga prefecture (60 kHz), respectively transmitting the standard radiowave. A long wave of 40 kHz or 60 kHz is provided with both of a property of propagating on the ground surface and property of propagating while being reflected by ionousphere and ground surface, and therefore, a propagating range is wide and all of Japan is covered by the above-describe two transmitting places.

A functional constitution of the radiowave timepiece 140 will be explained in details as follows.

An antenna 142 receives the standard radiowave of the long wave of 40 kHz or 60 kHz. The standard radiowave of the long wave subjects time information referred to as time code to an AM modulation to a carrier wave of 40 kHz or 60 kHz. The received standard radiowave of the long wave is amplified by an amplifier 143 and filtered and tuned by the filter portion 141 having a plurality of the piezoelectric vibrators 1.

The piezoelectric vibrator 1 according to the invention is respectively provided with quartz vibrator portions 148, 149 having resonance frequencies of 40 kHz and 60 kHz the same as the carrier frequencies.

Further, the filtered signal of the predetermined frequency is detected and decoded by a detecting and rectifying circuit 144. Successively, a time code is taken out by way of a waveform shaping circuit 145, and counted by CPU 146. CPU 146 reads information of current year, accumulated date, day of week, time or the like. The read information is reflected to RTC 148 and accurate time information is displayed.

The carrier wave is provided with 40 kHz or 60 kHz, and therefore, the vibrator having the structure of the tuning fork type is preferable for the quartz vibrator portions 148, 149.

Further, although the above-described explanation shows the example in Japan, the frequency of the standard radiowave of the long wave differs overseas. For example, in Germany, a standard radiowave of 77.5 kHz is used. Therefore, when the radiowave timepiece 140 capable of dealing with overseas is integrated to the portable apparatus, the piezoelectric vibrator 1 of a frequency which differs from that of the case of Japan is needed.

As described above, the radiowave timepiece 140 of the embodiment is provided with the piezoelectric vibrator 1 which is reduced in production cost as compared with the existing ones, and therefore, the radiowave timepiece 140 is also reduced in production cost.

What is claimed is:

1. A wafer polishing apparatus for polishing two head and tail faces of a wafer while supplying a polishing solution to adjust a thickness of the wafer to a predetermined thickness, wherein the wafer is in a shape of a plate substantially in an angular shape used as a raw material of a piezoelectric vibrator;
    wherein all of corner portions of the substantially angular shape are formed in a shape of a curved face by chamfering providing curvatures, and the corner portions substantially in the shape of the curved face includes at least a first curved face portion and a second curved face portion chamfered by the curvatures different from each other or the same curvature; and
    wherein a reference face of a crystal orientation of the raw material is specified by the first curved face portion or the second curved face portion,
    the wafer polishing apparatus comprising:
        a carrier in a shape of a circular plate an outer peripheral edge of which is made to constitute a gear portion and which is formed with a holding hole of containing the wafer;
        a planetary gear mechanism brought in mesh with the carrier by way of the gear portion and revolving the carrier around an axis line while rotating the carrier;
        an upper surface plate and a lower surface plate formed in a shape of a circular plate a center of which is hollowed and arranged on upper and lower sides of the carrier for squeezing both faces of the wafer while applying a predetermined load to the wafer contained in the holding hole; and
        polishing solution supplying means for supplying the polishing solution to between the upper surface plate and the lower surface plate;
        wherein the holding hole of the carrier includes an opening in a circular shape, and a curvature of the circular shape of the opening is the same as or smaller than the smallest curvature of the curvatures of the corner portions of the wafer.

2. The wafer polishing apparatus according to claim 1, wherein the wafer is constituted by substantially a rectangular shape, two of the corner portions contiguous to each other are made to constitute the first curved face portions and other two of the corner portions are made to constitute the second curved face portions; and
    wherein the reference face of the crystal orientation of the raw material is a face formed between the first curved face portions, or an end face formed between the second curved face portions.

3. The wafer polishing apparatus according to claim 1, wherein the curvature of the circular shape of the opening of the holding hole of the carrier by comprises a size that is equal to or smaller than 100% of a size of the smallest curvature of the curvatures of the corner portions of the wafer and equal to or larger than 90% of the size of the smallest curvature.

4. A wafer polishing method which is a wafer polishing method comprising a polishing step of adjusting a thickness of a wafer to a predetermined thickness by polishing both head and tail faces of the wafer according to claim 1 while supplying a polishing solution from polishing solution supplying means by a wafer polishing apparatus including a carrier in a shape of a circular plate an outer periphery edge of which is made to constitute a gear portion and which is formed with a holding hole of containing the wafer, a planetary gear mechanism brought in mesh with the carrier by way of the gear portion for revolving the carrier around an axis line while rotating the carrier, an upper surface plate and a lower surface plate formed in a shape of a circular plate a center of which is hollowed and arranged on upper and lower sides of the carrier for squeezing both faces of the wafer while applying a predetermined load to the wafer contained in the holding hole, and the polishing solution supplying means for supplying the polishing solution to between the upper surface plate and the lower surface plate;
    wherein the holding hole of the carrier includes an opening in a circular shape, and a curvature of the circular shape of the opening is the same as or smaller than the smallest curvature of curvatures of corner portions of the wafer.

5. The wafer polishing method according to claim 4, wherein the carrier, in which the curvature of the circular shape of the opening of the holding hole is constituted by a size equal to or smaller than the smallest curvature of the curvatures of the corner portions of the wafer by 100% and equal to or larger than the smallest curvature by 90% is used.

6. A method of fabricating a plurality of piezoelectric vibrators at a time utilizing a wafer polished by the wafer polishing method according to claim 4, the method comprising:
    an outer shape forming step of patterning outer shapes of the plurality of piezoelectric vibrating pieces to the wafer by etching the wafer as polished by a photolithography technology;
    an electrode forming step of respectively forming an exciting electrode of vibrating the piezoelectric vibrating piece when a predetermined voltage is applied thereto, and a mount electrode electrically connected to the exciting electrode by way of a leadout electrode by patterning an electrode film on outer surfaces of the plurality of piezoelectric vibrating pieces;
    a cutting step of cutting to separate the plurality of piezoelectric vibrating pieces from the wafer to fragment;
    a mount step of bonding the mount electrode of the fragmented piezoelectric vibrating piece to other end side of an external connecting terminal one end side of which is electrically connected to outside after the cutting step; and
    a sealing step of sealing the piezoelectric vibrating piece in airtight by a sealing member after the mount step.

7. A piezoelectric vibrator fabricated by the method of fabricating the piezoelectric vibrator according to claim 6.

8. An oscillator comprising the piezoelectric vibrator according to claim 7 electrically connected to an integrated circuit as an oscillating piece.

9. An electronic apparatus comprising the piezoelectric vibrator according to claim 7 electrically connected to a time counting portion.

10. A radiowave timepiece comprising the piezoelectric vibrator according to claim 7 electrically connected to a filter portion.

* * * * *

UNITED STATES PATENT AND TRADEMARK OFFICE
CERTIFICATE OF CORRECTION

PATENT NO. : 8,063,545 B2  
APPLICATION NO. : 12/361913  
DATED : November 22, 2011  
INVENTOR(S) : Takashi Kobayashi Page 1 of 1

It is certified that error appears in the above-identified patent and that said Letters Patent is hereby corrected as shown below:

In the Claims

In column 27, claim 3, line 60, after "holding hole of the carrier" delete "by".

Signed and Sealed this  
Tenth Day of April, 2012

David J. Kappos  
*Director of the United States Patent and Trademark Office*